(12) United States Patent
Sekine et al.

(10) Patent No.: US 11,659,290 B2
(45) Date of Patent: May 23, 2023

(54) LIGHT DETECTION SYSTEM

(71) Applicant: CANON KABUSHIKI KAISHA, Tokyo (JP)

(72) Inventors: Hiroshi Sekine, Kanagawa (JP); Kazuhiro Morimoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 127 days.

(21) Appl. No.: 17/377,207

(22) Filed: Jul. 15, 2021

(65) Prior Publication Data

US 2022/0029041 A1 Jan. 27, 2022

(30) Foreign Application Priority Data

Jul. 21, 2020 (JP) .............................. JP2020-124548
Mar. 31, 2021 (JP) .............................. JP2021-059047

(51) Int. Cl.

| H01L 31/02 | (2006.01) |
|---|---|
| H01L 31/107 | (2006.01) |
| H04N 25/76 | (2023.01) |
| G01S 17/88 | (2006.01) |
| H04N 25/47 | (2023.01) |
| H01L 27/146 | (2006.01) |

(52) U.S. Cl.
CPC ....... *H04N 25/47* (2023.01); *H01L 27/14643* (2013.01); *H01L 31/02027* (2013.01); *H01L 31/107* (2013.01); *H04N 25/76* (2023.01)

(58) Field of Classification Search
CPC ........ H04N 25/47; H04N 25/76; H04N 5/341; H04N 5/345; H04N 5/3454; H04N 5/3456; H04N 5/2258; H01L 27/14643; H01L 31/02027; H01L 31/107; G01S 17/88
See application file for complete search history.

(56) References Cited

U.S. PATENT DOCUMENTS

| 10,514,256 B1 * | 12/2019 | Kamarshi ............... G01C 3/08 |
| 10,915,783 B1 * | 2/2021 | Hallman ............... G06V 40/10 |
| 2018/0275278 A1 * | 9/2018 | Yamada ............... G01C 3/085 |
| 2019/0033433 A1 * | 1/2019 | Ryu ....................... G01S 17/42 |
| 2021/0183096 A1 * | 6/2021 | Yokokawa ............ G06T 7/593 |

OTHER PUBLICATIONS

Genevieve Gariepy, et al.; "Single-Photon Sensitive Light-In-Flight Imaging;" Nature Communications, Article Published Jan. 27, 2015; pp. 1-7.

Kazuhiro Morimoto, et al.; :Superluminal Motion-Assisted Four-Dimensional Light-In-Flight Imaging; Physical ReviewX 11, 011005 (2021); pp. 1-10.

Kazuhiro Morimoto, et al.; Superluminal Motion-Assisted 4-DIMENSIONAL Light-In-Flight Imaging; Physics Optics; Jul. 18, 2020; pp. 1-7.

* cited by examiner

*Primary Examiner* — Albert H Cutler
(74) *Attorney, Agent, or Firm* — Canon U.S.A., Inc. IP Division

(57) ABSTRACT

A system that can acquire a larger amount of information is provided. In the disclosure, calculation processing is performed on a data set including a plurality of pieces of data each including light amount distribution information on a two-dimensional plane that is acquired by a detection unit and time information indicating a time at which the light amount distribution information is acquired. In the calculation processing, among vectors in traveling directions of observation target light, a vector component in a direction orthogonal to the two-dimensional plane is estimated from the data set.

19 Claims, 14 Drawing Sheets

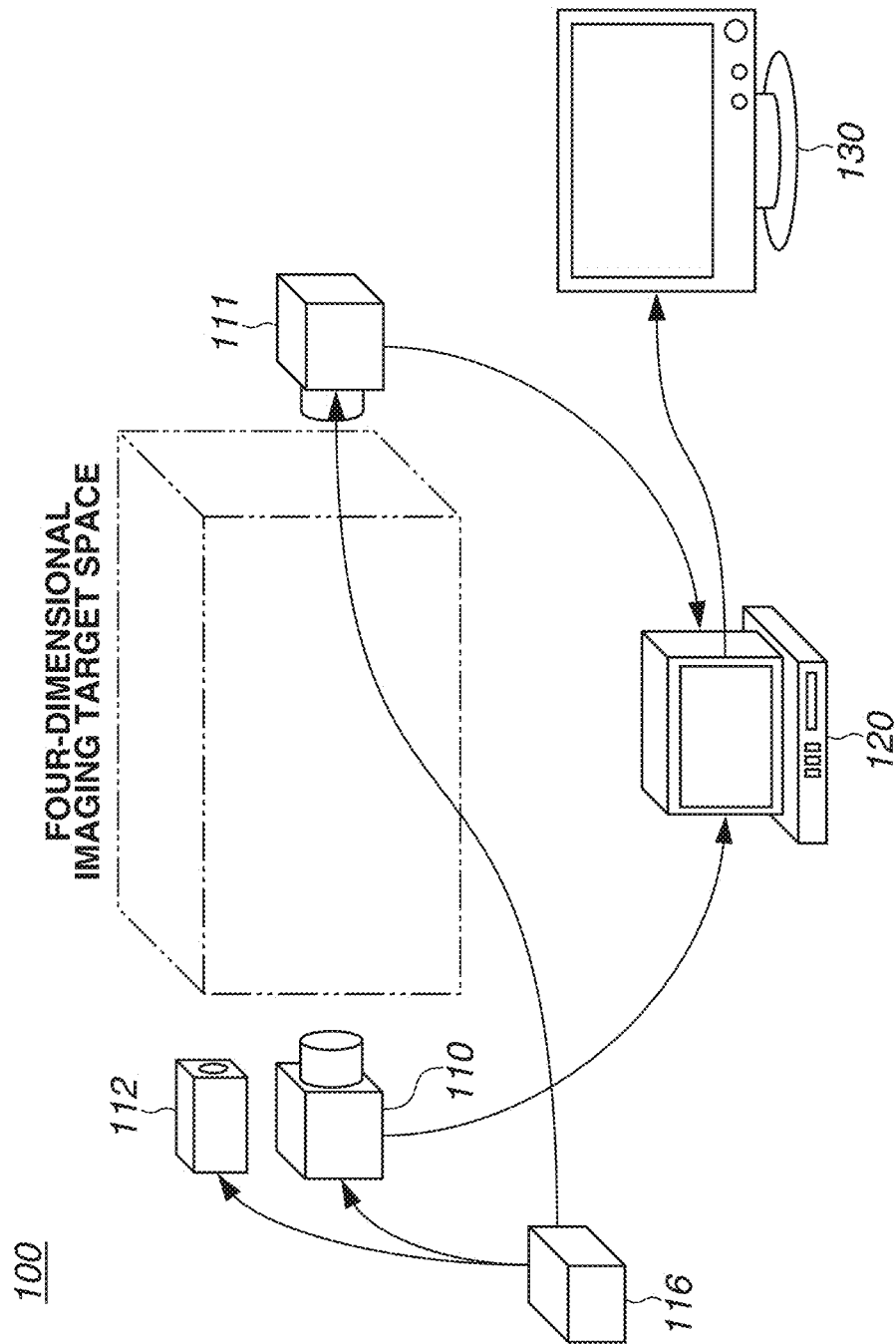

MOVING OBJECT MOVING AT SPEED SUFFICIENTLY LOWER THAN LIGHT SPEED

PULSED LIGHT TRAVELLING AT LIGHT SPEED

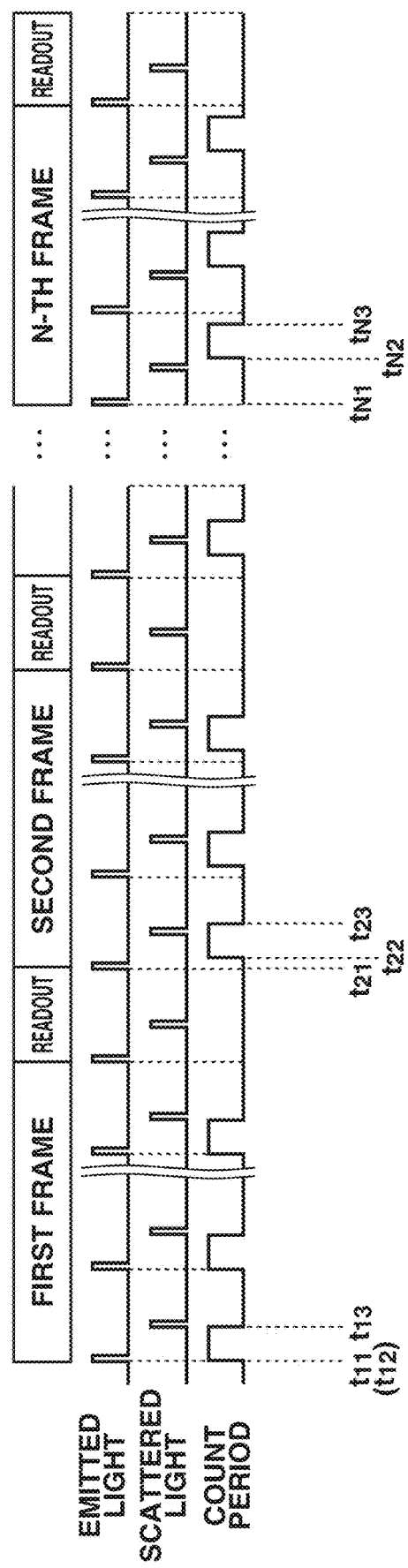

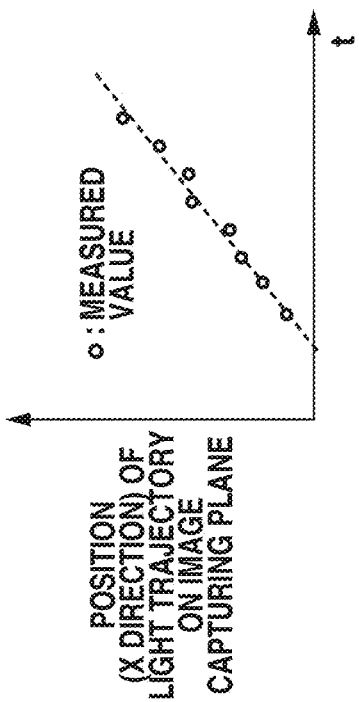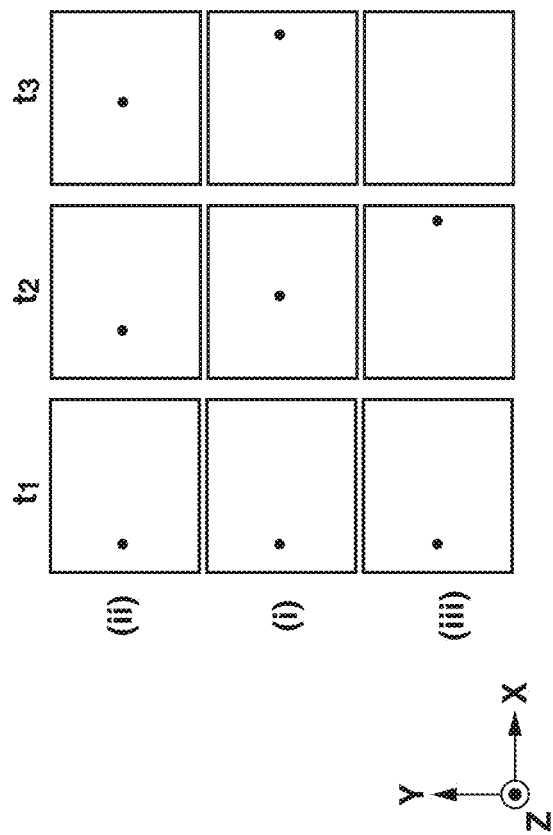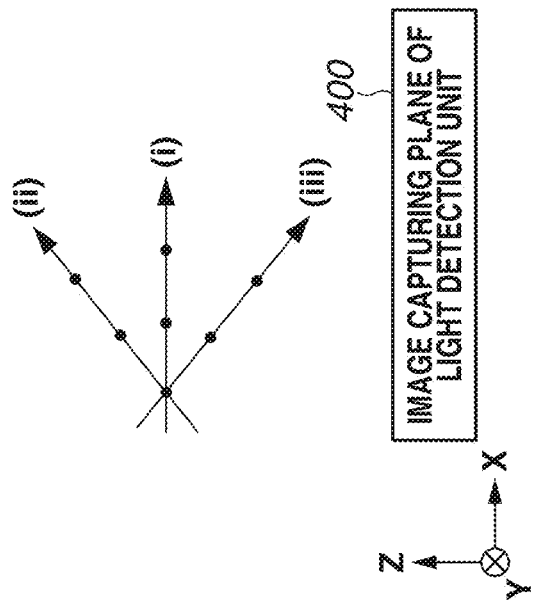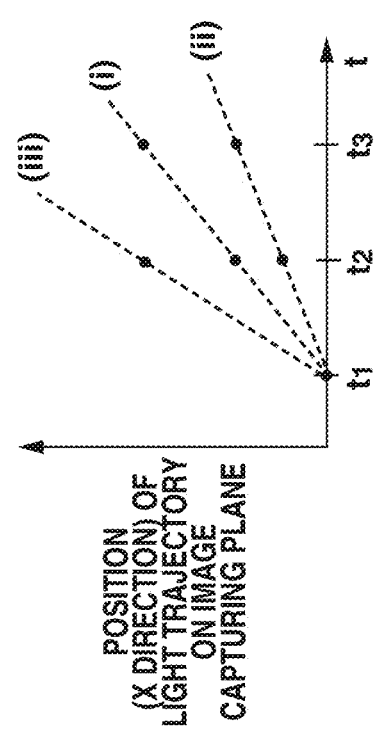

FACING ARRANGEMENT

FOUR-DIMENSIONAL IMAGING TARGET SPACE

PARALLEL ARRANGEMENT

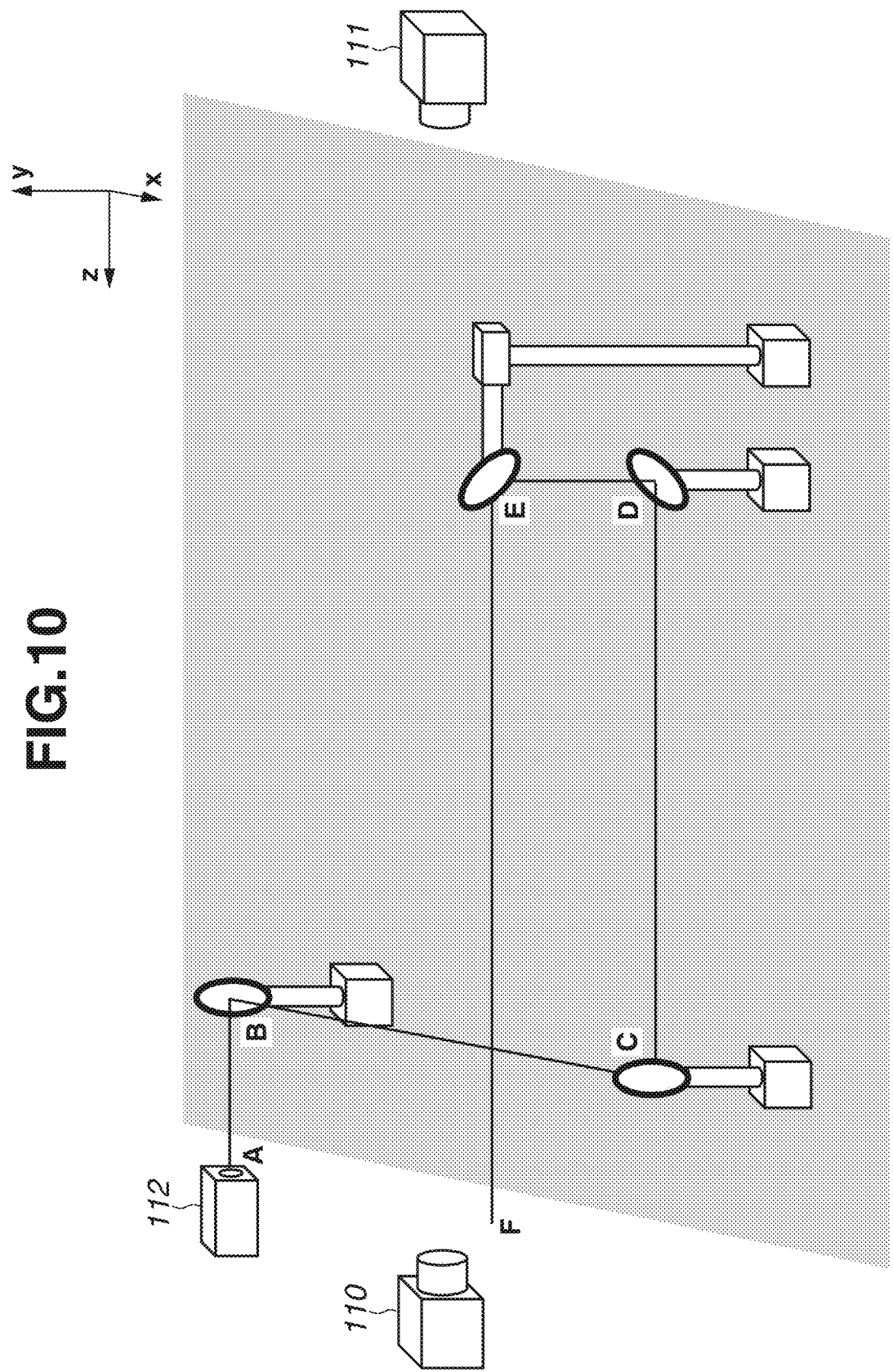

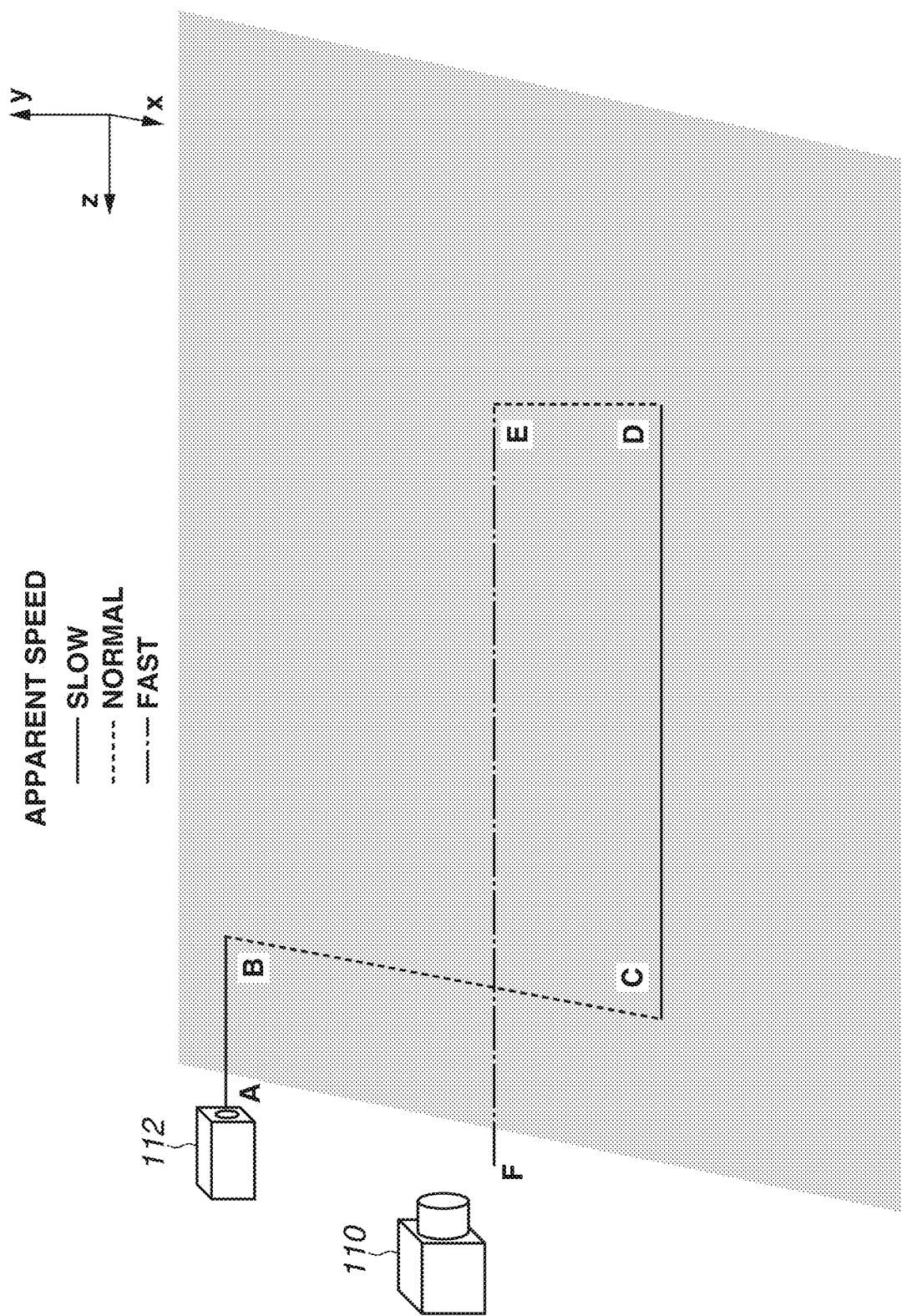

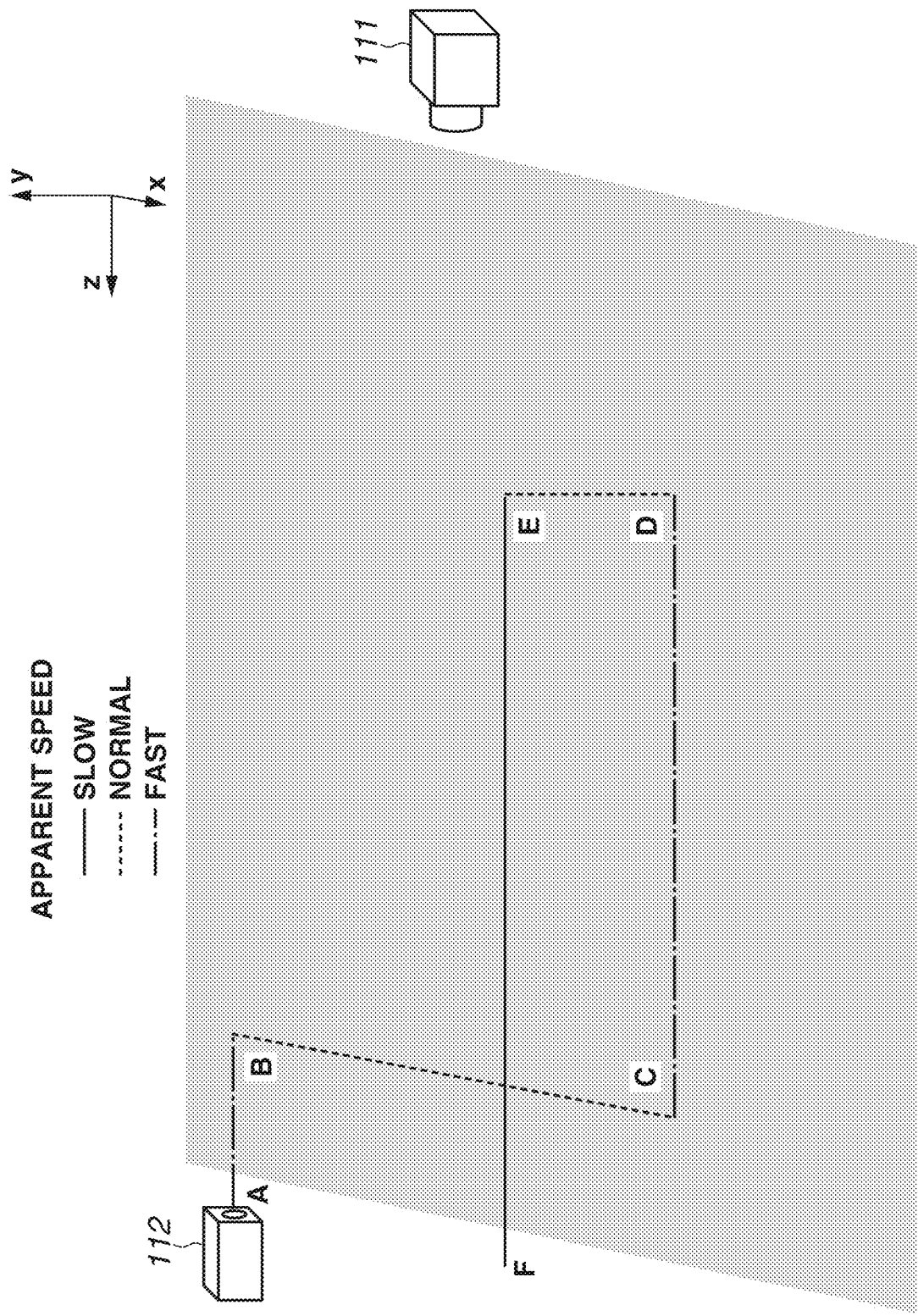

LIGHT DETECTION SYSTEM

BACKGROUND OF THE DISCLOSURE

Field of the Disclosure

The aspect of the embodiments relates to a system for capturing an image of propagating light.

Description of the Related Art

There has been known a photoelectric conversion element that digitally counts the number of photons reaching a light receiving unit and outputs a counted value from a pixel as a digital signal, in a light detection unit that uses an avalanche diode causing avalanche multiplication. Such a technique is called a single-photon avalanche diode (SPAD).

Because the SPAD has temporal resolution of picosecond order to nanosecond order, the SPAD is effective as one of high-speed image capturing techniques. In Gariepy, G. et al. Single-photon sensitive light-in-flight imaging. Nat. Commun. 6, 6021 (2015), image capturing of a state of propagating light is performed using an SPAD camera in which a plurality of avalanche diodes is two-dimensionally arrayed. Specifically, the SPAD camera is configured in such a manner that pulsed laser light output from a laser light source is reflected by a plurality of mirrors, and the SPAD camera can capture an image of a region in which laser light is reflected. The pulsed laser light from the laser light source is synchronized with a reference clock of time measurement of the SPAD camera, and the SPAD camera detects scattered light of the pulsed laser light in about 0.7 nanoseconds per frame. The SPAD camera can detect scattered light in a two-dimensional region (i.e., on an XY-plane). Thus, if time information about light detected by each pixel arranged on the XY-plane is measured a plurality of times and is subjected to statistical processing, scattered light generated by propagation of the laser light can be visualized. In addition, by chronologically displaying frames, a moving image of scattered light can be displayed.

In the technique discussed in Gariepy, G. et al. Single-photon sensitive light-in-flight imaging. Nat. Commun. 6, 6021 (2015), only one SPAD camera is provided, and an amount of acquirable information has been small.

SUMMARY OF THE DISCLOSURE

According to an aspect of the embodiments, a system includes a first detection unit in which a plurality of diodes is arrayed on a two-dimensional plane, a second detection unit in which a plurality of diodes is arrayed on a two-dimensional plane, and a processing unit configured to perform calculation processing on a data set including a plurality of pieces of data each including light amount distribution information on the two-dimensional plane that is acquired by the first detection unit and the second detection unit, and time information indicating a time at which the light amount distribution information is acquired, wherein the processing unit includes an estimation unit configured to estimate, from the data set, a vector component in a direction orthogonal to the two-dimensional plane of the first detection unit and a vector component in a direction orthogonal to the two-dimensional plane of the second detection unit, among vectors in traveling directions of observation target light.

According to another aspect of the embodiments, a system includes a first detection unit in which a plurality of diodes is arrayed on a two-dimensional plane, a second detection unit in which a plurality of diodes is arrayed on a two-dimensional plane, and a processing unit configured to perform calculation processing on a data set including a plurality of pieces of data each including light amount distribution information on the two-dimensional plane that is acquired by the first detection unit and the second detection unit, and time information indicating a time at which the light amount distribution information is acquired, wherein the processing unit acquires detection accuracy of information acquired from the first detection unit and detection accuracy of information acquired from the second detection unit based on information regarding a traveling direction of light that has been acquired by performing calculation processing on the data set.

Further features of the disclosure will become apparent from the following description of exemplary embodiments with reference to the attached drawings.

BRIEF DESCRIPTION OF THE DRAWINGS

FIG. 2 is a schematic diagram illustrating a light detection system according to an exemplary embodiment.

FIG. 5 is a diagram illustrating a drive pulse of a light detection unit according to an exemplary embodiment.

FIGS. 6A, 6B, 6C, and 6D are diagrams illustrating processing to be performed by a calculation processing unit according to an exemplary embodiment.

FIG. 10 is a diagram illustrating an image capturing target space.

FIG. 11 is a diagram illustrating an output image from a light detection unit.

FIG. 12 is a diagram illustrating an output image from a light detection unit.

DESCRIPTION OF THE EMBODIMENTS

Figure 1:
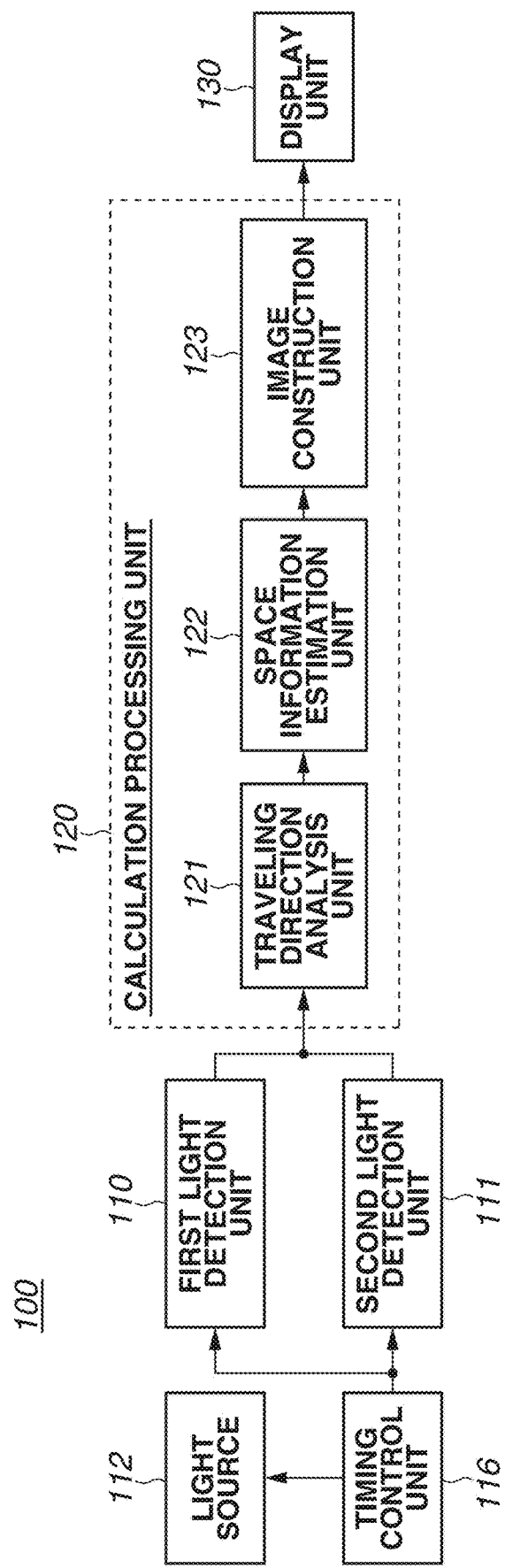
FIG. 1 is a block diagram illustrating a light detection system according to an exemplary embodiment.

The following exemplary embodiment is provided for embodying the technical idea of the disclosure, and is not intended to limit the disclosure. The sizes of and the positional relationship between members illustrated in the drawings may sometimes be exaggerated for clarifying the description. In the following description, the same components are indicated by the same reference numerals, and the description thereof may sometimes be omitted.

(Overall Configuration)

FIG. 1 is a block diagram illustrating a light detection system 100 according to the present exemplary embodiment. FIG. 2 is a schematic diagram illustrating the light detection system 100.

A light source 112 can emit short-pulse laser. For example, a picosecond laser can be used as the light source 112.

A light detection unit 110 (first light detection unit) and a light detection unit 111 (second light detection unit) are devices that detect scattered light generated by pulsed laser light emitted from the light source 112. The light detection units 110 and 111 may also detect the pulsed laser light emitted from the light source 112. Each of the light detection units 110 and 111 is a single-photon avalanche diode (SPAD) array in which a plurality of SPAD pixels is arrayed in directions of a two-dimensional plane (i.e., X and Y directions). As long as light can be detected at high speed, the light detection units 110 and 111 do not have to use the SPAD pixels. As illustrated in FIG. 2, for example, the light detection units 110 and 111 are arranged facing each other across a four-dimensional imaging target space.

A timing control unit 116 is provided for synchronizing light detection timings of the light detection units 110 and 111 with an emission timing of the light source 112. The synchronization naturally includes a case where an emission timing of the light source 112 and a start timing of light detection are the same and a case where these timings are different and a difference between the timings is based on a control signal from the timing control unit 116. In other words, controlling the emission timing of the light source 112 and the start timings of light detection of the light detection units 110 and 111 based on a common control signal from the timing control unit 116 is referred to as the synchronization.

A calculation processing unit 120 processes signals input from the light detection units 110 and 111. The calculation processing unit 120 includes a traveling direction analysis unit 121, a space information estimation unit (estimation unit) 122, and an image construction unit 123.

The traveling direction analysis unit 121 analyzes a traveling direction of the pulsed laser light based on light amount distribution information in a two-dimensional space of a plurality of frames that is output from the light detection units 110 and 111. More specifically, the traveling direction analysis unit 121 obtains a traveling direction of light on an image capturing plane (XY-plane) based on information about x (X-direction information), y (Y-direction information), and t (time information), and groups light trajectories by a traveling direction of light.

The space information estimation unit 122 estimates space information about a Z direction component among components of the traveling direction of light for each traveling direction of pulsed laser light that has been calculated by the traveling direction analysis unit 121. In other words, the space information estimation unit 122 obtains four-dimensional information of x, y, z, and t from three-dimensional information of x, y, and t. A specific estimation method will be described below.

The image construction unit 123 constructs a desired image from the four-dimensional information input from the space information estimation unit 122, and outputs information to a display unit 130. For example, the image construction unit 123 selects the three-dimensional information of x, y, and z from the four-dimensional information of x, y, z, and t, and outputs information representing a light trajectory of pulsed laser light to an XYZ-space. The image construction unit 123 may have a function of processing information in such a manner that a light trajectory can be viewed from a desired angle, by performing coordinate conversion of the XYZ-space. The image construction unit 123 may construct an image displaying two pieces of space information and a piece of time information as with the three-dimensional information of x, y, and t from the four-dimensional information of x, y, z, and t, and output the information to the display unit 130.

The image construction unit 123 acquires accuracy of information (first information) acquired from the light detection unit 110 (first light detection unit) and accuracy of information (second information) acquired from the light detection unit 111 (second light detection unit), and determines which information has higher accuracy.

For example, in a case where there is a plurality of traveling directions of light, in image capturing of a light trajectory in a first traveling direction, accuracy of information (first information) acquired by the light detection unit 110 may be higher than the accuracy of information (second information) acquired by the light detection unit 111. Alternatively, in image capturing of a light trajectory in a second traveling direction, the accuracy of information (second information) acquired by the light detection unit 111 may be higher than the accuracy of information (first information) acquired by the light detection unit 110. In this situation, the light trajectory in the first traveling direction constructs an image based on the information (first information) acquired by the light detection unit 110, and the light trajectory in the second traveling direction constructs an image based on the information (second information) acquired by the light detection unit 111.

In other words, the image construction unit 123 selects information with high accuracy, and constructs an image by integrating pieces of information with high accuracy.

The display unit 130 displays an image based on a signal input from the image construction unit 123. An image may be displayed on the display unit 130 by selecting information output from the image construction unit 123, by an operation of a user.

The calculation processing unit 120 includes a memory (not illustrated) that stores information regarding ongoing calculation or information regarding a calculation result.

Meanwhile, as described below, in one configuration of calculation processing, the traveling direction analysis unit 121 can select, from among a plurality of light detection units, a light detection unit that can acquire information with high accuracy for a light trajectory of each group. In this case, the space information estimation unit 122 performs calculation based on information from a light detection unit that can acquire information with high accuracy. For example, in the above-described example, as for the light trajectory in the first traveling direction, the space information about a Z direction component is acquired based on the information (first information) acquired by the light detection unit 110 and the information (second information) acquired by the light detection unit 111 is not used. In contrast, as for the light trajectory in the second traveling direction, the space information about a Z direction component is acquired based on the information (second information) acquired by the light detection unit 111, and the information (first information) acquired by the light detection unit 110 is not used. The image construction unit 123 integrates the four-dimensional information about the light trajectory in the first traveling direction and the four-dimensional information about the light trajectory in the second traveling direction that have been calculated by the space information estimation unit 122.

The above description has been given of the example of light trajectories in two traveling directions corresponding to the light trajectory in the first traveling direction and the light trajectory in the second traveling direction, but a light trajectory in one traveling direction may be analyzed based on information from a light detection unit determined to have high accuracy.

(Apparent Speed)

Hereinafter, an apparent speed to be used to acquire space information regarding the Z direction from space information on the XY-plane and time information will be described.

FIGS. 3A, 3B, 3C, 3D, 3E, and 3F are diagrams illustrating a difference between an apparent speed of a moving object moving at a speed sufficiently slower than a light speed and an apparent speed of pulsed light traveling at the light speed.

Figure 3A:
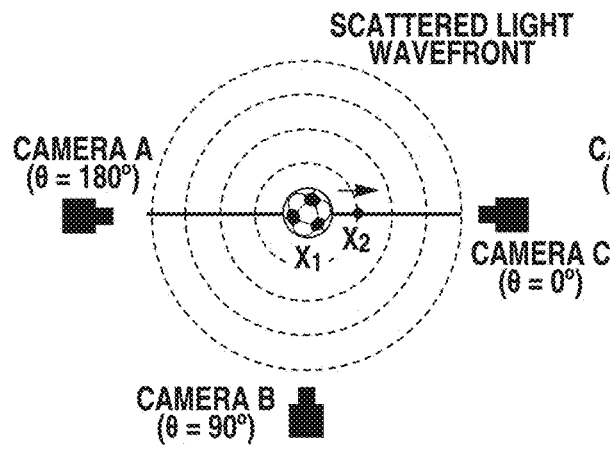
FIGS. 3A, 3B, 3C, 3D, 3E, and 3F are diagrams illustrating a difference between a moving object moving at a speed sufficiently lower than a light speed, and pulsed light traveling at the light speed.

FIG. 3A illustrates an example of a ball that moves as an example of a moving object moving at a speed sufficiently slower than the light speed. FIG. 3A illustrates a camera C ($\theta=0°$) provided in the same direction as a traveling direction of the moving object, a camera A ($\theta=180°$) provided in a direction opposite to the traveling direction of the moving object, and a camera B ($\theta=90°$) provided in a direction orthogonal to the traveling direction of the moving object.

Figure 3D:
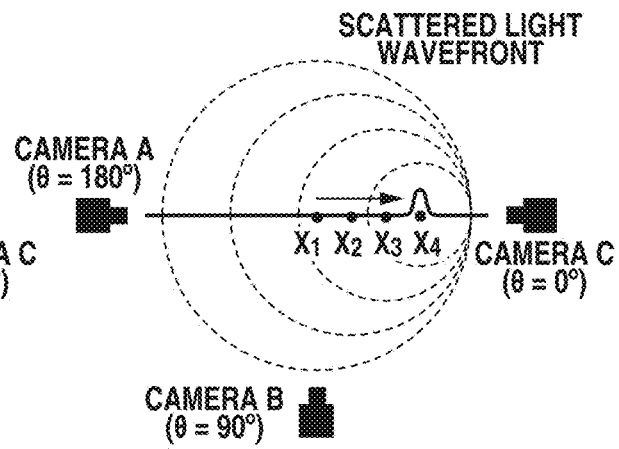
Figure 3B:
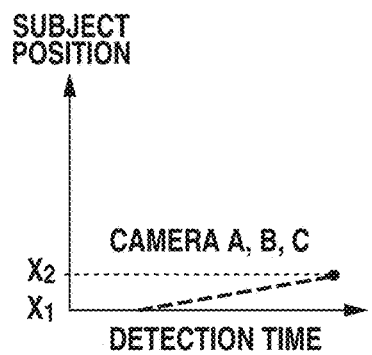

FIG. 3B illustrates a relationship between a position of the moving object (subject position), and a time at which each of the cameras detects scattered light from the moving object (detection time). Because the moving object hardly moves while scattered light from the moving object reaches the cameras, the detection times of the cameras A, B, and C have the same tendency irrespective of the position of the moving object.

Figure 3E:
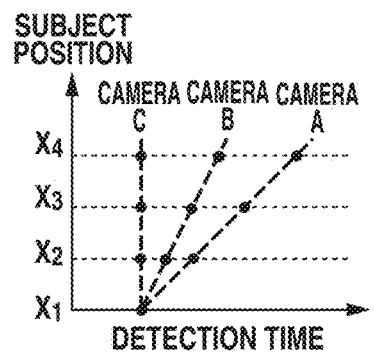
Figure 3C:
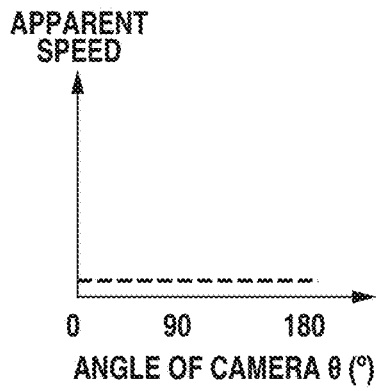

FIG. 3C illustrates a relationship between an apparent speed and an angle $\theta$ at which a camera is provided with respect to the traveling direction of the moving object. The apparent speed corresponds to a movement amount of moving object per detection time. Since the movement amount of moving object per detection time is constant as seen in FIG. 3B, the apparent speed becomes constant as well. FIG. 3C illustrates such a relationship. In other words, the apparent speed of the moving object becomes constant irrespective of the traveling direction of the moving object with respect to each of the cameras.

On the other hand, FIG. 3D illustrates an example of pulsed light traveling at the light speed. Similarly to FIG. 3A, the camera C ($\theta=0°$) is provided in the same direction as a traveling direction of the pulsed light, the camera A ($\theta=180°$) is provided in a direction opposite to the traveling direction of the pulsed light, and the camera B ($\theta=90°$) is provided in a direction orthogonal to the traveling direction of the pulsed light.

FIG. 3E illustrates a relationship between a position of the pulsed light (subject position), and a time (detection time) at which each of the cameras detects scattered light generated by the pulsed light. While the scattered light of the pulsed light generated at a predetermined position reaches a camera, the pulsed light that generates the scattered light travels as well. Thus, detection times of the cameras A, B, and C provided at different positions become different from each other. Specifically, scattered light rays generated at positions X1 to X4 are simultaneously detected by the camera C. On the other hand, because the scattered light rays generated at the positions X1 to X4 reach the camera A in the order of X1, X2, X3, and X4, detection times of the scattered light rays from the respective positions are different in the camera A.

Similarly to the camera A, because the scattered light rays generated at the positions X1 to X4 reach the camera B in the order of X1, X2, X3, and X4, detection times of the scattered light rays from the respective positions are different also in the camera B. Nevertheless, as compared with the position at which the camera A is provided, distances between the position at which the camera B is provided and the respective positions at which the scattered light rays are generated are almost constant. Thus, intervals between the detection times at which the camera B detects the scattered light rays generated at the respective positions become shorter than intervals between the detection times of the camera A. Consequently, a relationship as illustrated in FIG. 3E is obtained.

Figure 3F:
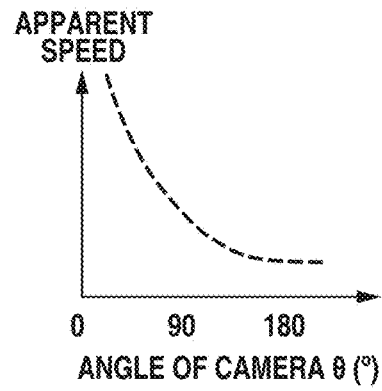

FIG. 3F illustrates a relationship between an apparent speed and an angle $\theta$ at which a camera is provided with respect to the traveling direction of the pulsed light. As seen in FIG. 3E, the apparent speed (i.e., the movement amount of scattered light per detection time) varies for each camera. Specifically, an apparent speed of the scattered light detected by the camera B ($\theta=90°$) becomes higher than that of the camera A ($\theta=180°$). In addition, an apparent speed of scattered light detected by the camera C ($\theta=0°$) becomes infinite. FIG. 3F illustrates such a relationship. In other words, an apparent speed of pulsed light observed by each camera varies depending on the traveling direction of the pulsed light with respect to each camera.

As described above, by analyzing the speed in the traveling direction of the light to be observed by the camera, it becomes possible to estimate a vector in the traveling direction of the light in a new dimension. Specifically, it becomes possible to estimate information regarding the Z direction (direction orthogonal to a two-dimensional plane) from a data set including a plurality of pieces of light amount distribution information on the XY-plane (two-dimensional plane) acquired by the light detection unit of the camera, and a plurality of pieces of time information each indicating a time at which the light amount distribution information is acquired. Accordingly, it becomes possible to acquire four-dimensional spatiotemporal information from three-dimensional spatiotemporal information.

As seen in FIG. 3F, the apparent speed greatly varies depending on the position of the camera with respect to the traveling direction of light. For example, because the apparent speed of the scattered light detected by the camera C ($\theta=0°$) is infinite, even if an image capturing technique with high temporal resolution is used, it becomes difficult to detect the scattered light. Consequently, accuracy of the acquired three-dimensional spatiotemporal information becomes lower, and accuracy of the estimated information regarding the Z direction also becomes lower. On the other hand, because the apparent speed of the scattered light detected by the camera A ($\theta=180°$) is relatively slower, the three-dimensional spatiotemporal information with high accuracy can be acquired. Consequently, accuracy of the estimated information regarding the Z direction also becomes higher. For this reason, for example, by using a plurality of cameras, selecting a camera that can acquire information with high accuracy for each traveling direction of light, and combining or integrating pieces of information from the selected camera, it becomes possible to acquire spatiotemporal information with high accuracy.

(Light Detection Unit)

Figure 4:
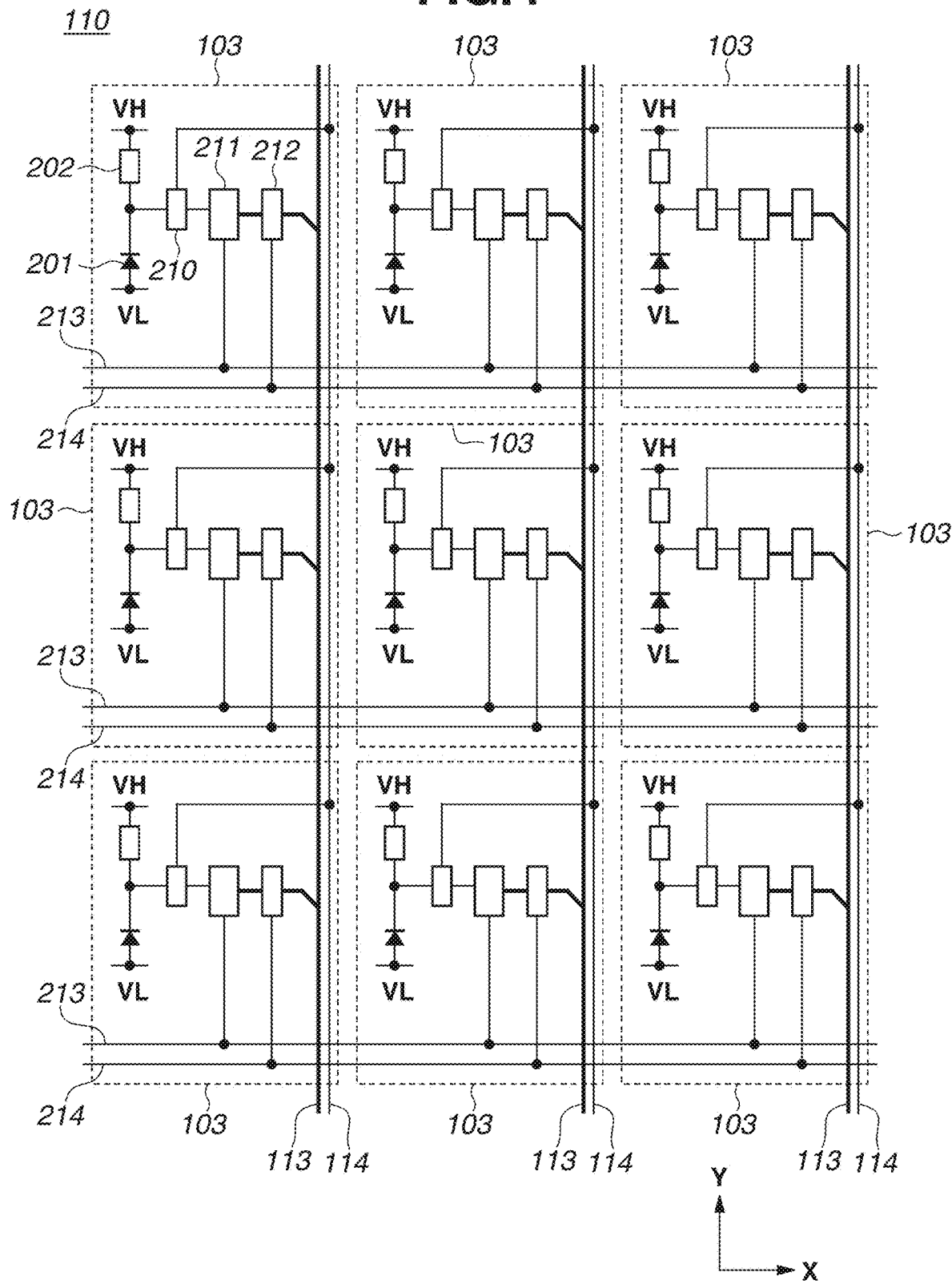
FIG. 4 is a configuration diagram illustrating a light detection unit according to an exemplary embodiment.

FIG. 4 illustrates the light detection unit 110. In a pixel region, a plurality of SPAD pixels 103 is two-dimensionally arrayed in the X and the Y directions.

Each SPAD pixel 103 includes a photoelectric conversion element 201 (avalanche diode), a quench element 202, a control unit 210, a counter/memory 211, and a readout unit 212.

An electric potential that is based on an electric potential VH higher than an electric potential VL supplied to an anode is supplied to a cathode of the photoelectric conversion element 201. Electric potentials are supplied to the anode and the cathode of the photoelectric conversion element 201 in such a manner that reverse bias causing avalanche multiplication of photons entering the photoelectric conversion element 201 is applied. By performing photoelectric conversion in a state in which such a reverse bias electric potential is supplied, electric charges generated by incident light cause avalanche multiplication, and an avalanche current is generated.

In a case where the reverse bias electric potential is supplied, when an electric potential difference between the anode and the cathode is larger than a breakdown voltage, an avalanche diode performs a Geiger mode operation. An avalanche diode that detects a weak signal of a single photon level at high speed using the Geiger mode operation is the SPAD.

The quench element 202 is connected to the photoelectric conversion element 201 and a power source that supplies the high electric potential VH. The quench element 202 includes a P-type metal-oxide semiconductor (MOS) transistor or a resistive element such as a polysilicon resistor. The quench element 202 may include a plurality of series MOS transistors. If a photocurrent is multiplied by avalanche multiplication in the photoelectric conversion element 201, a current obtained by multiplied electric charges flows in a connection node of the photoelectric conversion element 201 and the quench element 202. By a voltage drop caused by the current, an electric potential at the cathode of the photoelectric conversion element 201 drops, and the photoelectric conversion element 201 stops forming an electronic avalanche. The avalanche multiplication in the photoelectric conversion element 201 thereby stops. Then, the electric potential VH of the power source is supplied to the cathode of the photoelectric conversion element 201 via the quench element 202. Thus, the electric potential supplied to the cathode of the photoelectric conversion element 201 returns to the electric potential VH. In other words, an operation region of the photoelectric conversion element 201 returns to the Geiger mode operation. In this manner, the quench element 202 functions as a load circuit (quench circuit) that has a function of suppressing avalanche multiplication (quench operation) when electric charges are multiplied by avalanche multiplication. The quench element 202 also has a function of bringing the operation region of the avalanche diode into the Geiger mode again after suppressing avalanche multiplication.

The control unit 210 determines whether to count an output signal from the photoelectric conversion element 201. For example, the control unit 210 is a switch (gate circuit) provided between the photoelectric conversion element 201 and the counter/memory 211. A gate of the switch is connected to a pulse line 114, and on/off of the control unit 210 is switched based on a signal input to the pulse line 114. For example, in FIG. 4, signals input to pulse lines 114 from a horizontal scanning circuit unit (not illustrated) are collectively controlled in all columns. Thus, a start and an end of light detection can be controlled collectively in all SPAD pixels. Such control is sometimes called global shutter control.

The control unit 210 may include a logic circuit instead of a switch. For example, if an AND circuit is provided as the logic circuit, and a first input to the AND circuit is set to be an output from the photoelectric conversion element 201 and a second input is set to be a signal from the pulse line 114, it becomes possible to switch whether to count the output signal from the photoelectric conversion element 201.

Furthermore, the control unit 210 needs not be provided between the photoelectric conversion element 201 and the counter/memory 211, and may be a circuit that inputs a signal for switching between operation and non-operation of a counter of the counter/memory 211.

The counter/memory 211 counts the number of photons entering the photoelectric conversion element 201, and holds the number as digital data. A reset line 213 is provided to each row. When a control pulse is supplied to the reset line 213 from a vertical scanning circuit unit (not illustrated), a held signal is reset.

The readout unit 212 is connected to the counter/memory 211 and a readout signal line 113. A control pulse is supplied to the readout unit 212 from the vertical scanning circuit unit (not illustrated) via a control line, so that the readout unit 212 switches whether to output a count value of the counter/memory 211 to the readout signal line 113. The readout unit 212 includes a buffer circuit for outputting a signal, for example.

The readout signal line 113 may be a signal line for outputting a signal to the calculation processing unit 120 from the light detection unit 110, or may be a signal line for outputting a signal to a signal processing unit provided in the light detection unit 110. In addition, the horizontal scanning circuit unit (not illustrated) and the vertical scanning circuit unit (not illustrated) may be provided on a substrate on which an SPAD array is provided, or may be provided on a substrate different from the substrate on which the SPAD array is provided.

The above description has been given of a configuration in which a counter is used, but a time to digital converter (TDC) may be provided in place of the counter, so that a pulse detection timing may be acquired, and information may be stored in a memory.

(Timing Chart)

FIG. 5 illustrates a timing at which the light source 112 emits pulsed laser light and a timing at which an object (e.g., water vapor or dust) is irradiated with the pulsed laser light and scattered light of the pulsed laser light reaches the light detection unit 110. FIG. 5 also illustrates a timing at which the light detection unit 110 detects light (counts a light amount).

In a first frame, a time t11 (t12) corresponds to a start time of light emission and a start time of light detection, and a time t13 corresponds to an end time of the light detection. In the first frame illustrated in FIG. 5, at a time at which the scattered light reaches the light detection unit 110, the light detection unit 110 is not detecting light, and the scattered light is not detected. The light detection unit 110 detects light a plurality of times in the first frame to acquire a light amount distribution on the XY-plane. When the plurality of times of light detection ends in each frame, a value stored in a memory is read out.

Meanwhile, as illustrated in FIG. 4, the plurality of SPAD pixels 103 is arranged in an array shape in the light detection unit 110. A timing of a light detection start of the plurality of SPAD pixels 103 arranged in each row is collectively controlled in all pixels. In other words, in all the pixels of the SPAD, a timing of emitted light and a timing of a count period that are illustrated in FIG. 5 are the same.

In a second frame, emitted light is emitted at a time t21, light detection starts at a time t22, and the light detection ends at a time t23. In the second frame, a period from the time at which the emitted light is emitted to the time at which the light detection is started is longer than that in the first frame. In the second frame illustrated in FIG. 5, at a time at which the scattered light reaches the light detection unit 110, the light detection unit 110 is detecting light, and the scattered light is detected.

Subsequently, frames are set in such a manner that a period between an emission time of the emitted light and a light detection start time becomes gradually longer. In an N-th frame, the emitted light is emitted at a time tN1, the light detection is started at a time tN2, and the light detection ends at a time tN3.

The light detection unit 110 is an SPAD array in which SPAD pixels are two-dimensionally arrayed. Thus, as seen in a timing chart as described above, the light detection unit 110 can acquire, for each frame, a plurality of sets of data each including the light amount distribution information on the XY-plane (image capturing plane), and the time information indicating a time at which the light amount distribution information is acquired. Hereinafter, light amount distribution information at a predetermined time will be referred to as data, and pieces of light amount distribution information at the respective times will be referred to a data set. From the data set, information regarding x, y, and t can be acquired.

The light detection unit 111 also performs control similar to the above-described control performed by the light detection unit 110, and acquires a data set including light amount distribution information and time information. Nevertheless, because the light detection unit 111 is arranged at a position different from a position at which the light detection unit 110 is arranged, a timing at which the scattered light reaches the light detection unit 110 that is illustrated in FIG. 5, and a timing at which scattered light reaches the light detection unit 111 are different.

In the above-described exemplary embodiment, the four-dimensional spatiotemporal information can be acquired from the three-dimensional spatiotemporal information. Accordingly, it becomes possible to acquire the space information that has been unable to be separated using information acquired from a detector with a two-dimensional array, and a more sophisticated light detection system can be provided.

Since the light detection system includes the plurality of light detection units, information from a light detection unit having relatively higher detection accuracy can be used. Accordingly, the light detection system with higher accuracy can be provided.

(Concept of Calculation Processing)

FIGS. 6A, 6B, 6C, and 6D are diagrams illustrating the concept of processing to be performed by the calculation processing unit 120.

FIG. 6A illustrates an image capturing plane 400 of the light detection unit 110 or 111. The image capturing plane 400 has an XY-plane. Arrows indicate vectors in traveling directions of light. FIG. 6A illustrates light traveling in a direction (i) parallel to the image capturing plane 400, light traveling in a direction (ii) moving away from the image capturing plane 400, and light traveling in a direction (iii) moving toward the image capturing plane 400. In FIG. 6A, for the sake of simplification, it is assumed that the light has vector components in the X direction and the Z direction, and does not have a vector component in the Y direction.

FIG. 6B illustrates light trajectories of the above-described light traveling in the directions (i) to (iii) that are to be obtained by performing image capturing on the image capturing plane 400 at times t1 to t3. If a frame rate is slow, a linear light trajectory is observed. If an apparent speed of light is slow, a trailing light trajectory is observed. Thus, FIG. 6B illustrates a rising edge portion (leading end portion of the light trajectory) of light intensity with respect to the traveling direction of light.

As illustrated in FIG. 6B, while the light has vector components in the X direction and the Z direction, the vector component in the Z direction is projected on the XY-plane to be subjected to image capturing at each time, and information regarding the Z direction cannot be extracted. As illustrated in FIG. 6B, as compared with the light traveling in the traveling direction (i), an apparent speed of the light traveling in the traveling direction (ii) becomes slower. In contrast, as compared with the light traveling in the traveling direction (i), an apparent speed of the light traveling in the traveling direction (iii) becomes faster.

FIG. 6C is a diagram illustrating a relationship between the times t1 to t3 and a position (in the X direction) of a light trajectory on the image capturing plane 400. In FIG. 6C, the light traveling in the traveling directions (i) to (iii) and having different vector components in the Z direction are described by different functions.

For example, if light is described using a linear approximation method, a position in the X direction (objective variable)=a+b*time (explanatory variable) is obtained, and values of coefficients a and b are different due to a difference in vector component in the Z direction.

To describe an actual light trajectory, a vector component in the Y direction, a distance between a generation position of scattered light and an image capturing plane of light detection, and a nonlinear effect attributed to a directional vector from a light detection unit to pulsed light changing with time as the pulsed light travels are considered. Thus, the numbers of variables and coefficients increase, and a model becomes more complicated, but functions describing position information of light on an image capturing plane and time information remain to vary depending on a vector component in the Z direction of the light.

FIG. 6D illustrates data (measured value) measured by the light detection unit 110 or 111 and plotted on a time axis and an axis of a position (in the X direction) of the light on an image capturing plane, similarly to FIG. 6C. By searching for a function fitting the measured values and by extracting a vector component in the Z direction from the function, it is possible to estimate the vector component in the Z direction.

More specifically, a model for calculating one-dimensional position information (vector information regarding the X direction) on the light detection unit and time information based on two-dimensional space information (vector information regarding the X and Z directions) and time information is created. Then, if vector information regarding the X and Z directions and time information that can sufficiently explain the information about X direction and the time information, which are actual measurement data, can be retrieved, a vector component in the Z direction can be estimated. Such calculation can be expressed as solving an inverse issue because a motion of observation target light is estimated from the actual measurement data.

Furthermore, a model for calculating two-dimensional space information (vector information regarding the X and Y directions) on the light detection unit) and time information based on three-dimensional space information (vector information regarding the X, Y, and Z directions) and time information is created by extending the dimension. Then, if three-dimensional space information (vector information regarding the X, Y, and Z directions) and time information that can sufficiently explain the information regarding the X and Y directions and the time information (data set), which are actual measurement data, can be retrieved, the vector component in the Z direction can be estimated. More specifically, by fitting the data set, which includes measured values, and the two-dimensional space information on the light detection unit and the time information that have been calculated using the model, the three-dimensional space information and the time information are acquired. Then, the vector component in the Z direction is estimated from the acquired three-dimensional space information and time information.

(Procedure of Calculation Processing)
(First Calculation Processing)

Figure 7:
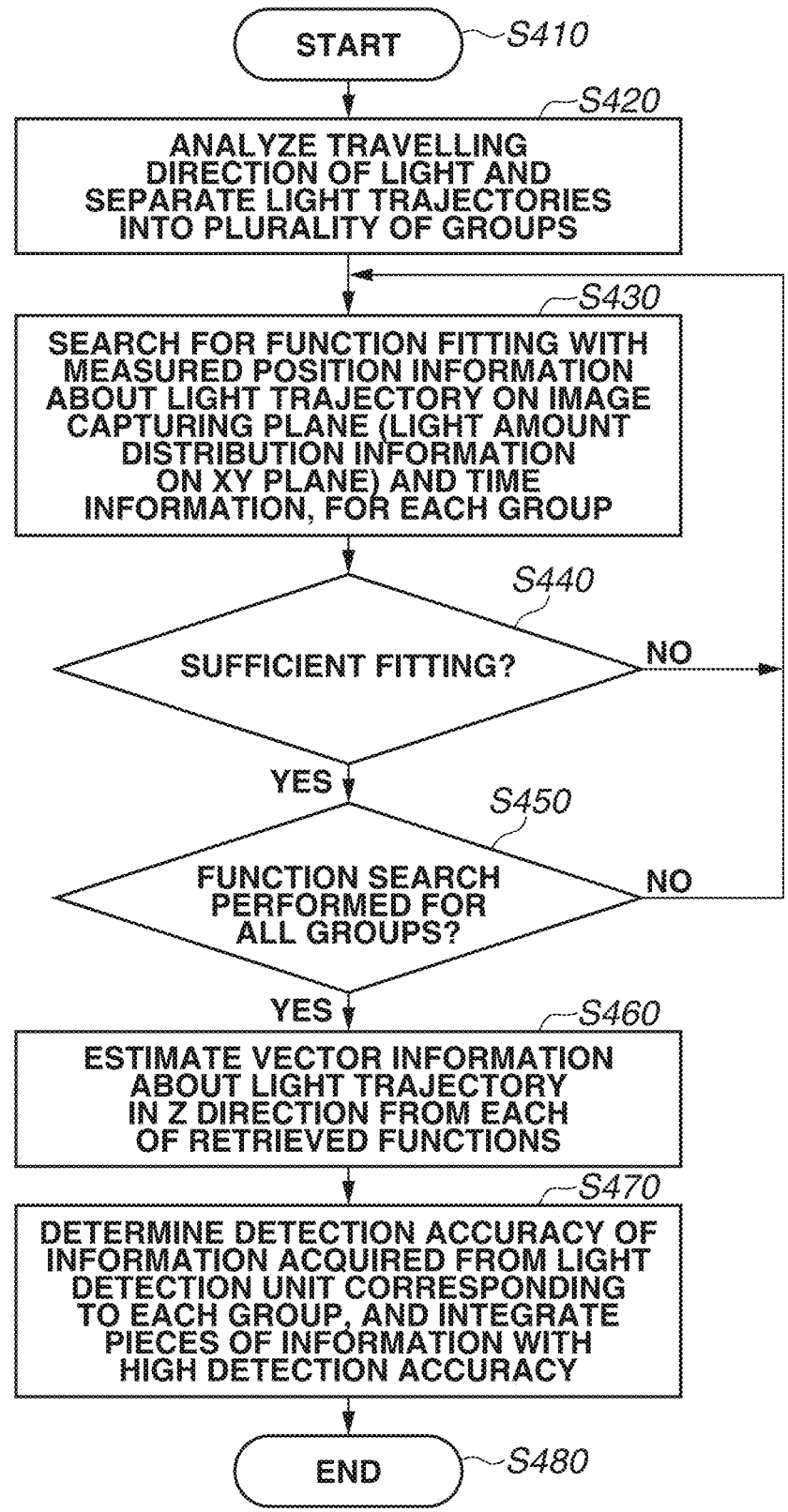
FIG. 7 is a flowchart illustrating processing to be performed by a traveling direction analysis unit, a space information estimation unit, and an image construction unit according to an exemplary embodiment.

FIG. 7 is a diagram illustrating a procedure of calculation processing to be performed by the traveling direction analysis unit 121, the space information estimation unit 122, and the image construction unit 123 that are illustrated in FIG. 1.

In step S410, the calculation processing is started. Then, in step S420, the traveling direction analysis unit 121 analyzes the traveling direction of light and separates light trajectories into a plurality of groups. Such grouping processing is individually performed on pieces of information acquired from each of the light detection units 110 and 111.

Next, in step S430, for each group, the space information estimation unit 122 searches for a fitting function using measured position information about a light trajectory on an image capturing plane (light amount distribution information on the XY-plane), and time information corresponding to the position information about each light trajectory. The search is performed for each group because a vector component in the Z direction varies between light trajectories belonging to different groups, and a fitting function also varies.

Next, in step S440, the space information estimation unit 122 evaluates fitting of the retrieved function with the measured values, and determines whether the fitting is sufficient. Whether the fitting is sufficient is determined, for example, by using a least-square method to determine whether a square sum of residual errors between calculated values calculated by a model and the measured values is a predetermined value or less. Alternatively, if the number of repetition times of calculation reaches a predetermined number, it may be determined that the fitting is sufficient.

Next, in step S450, the space information estimation unit 122 determines whether a function search has been performed with respect to measured values for all groups.

Next, in step S460, the space information estimation unit 122 estimates vector information about a light trajectory in the Z direction at each time from each of retrieved functions.

Next, in step S470, the image construction unit 123 acquires and determines detection accuracy of information acquired from each of the light detection units, with respect to a light trajectory belonging to each group.

Specifically, angles at which light detection units are provided with respect to the traveling direction of light are compared, and the accuracy of information acquired from a light detection unit provided at a position where the angle is large is determined to be high. For example, referring to FIG. 3D, it is assumed that there are the camera B provided at a position where the angle θ=90° and a camera D (not illustrated) provided at a position where the angle θ=45°, with respect to light traveling in a rightward direction in FIG. 3D. In this case, information acquired from the camera B provided at the position where the angle is large with respect to the traveling light is information with higher accuracy than that of information acquired from the camera D. Thus, as for a group of light traveling in the rightward direction in FIG. 3D, it is determined that the accuracy of information acquired from the camera B is higher than that of information acquired from the camera D. On the other hand, as for light traveling in a leftward direction in FIG. 3D, because the camera D is provided at a position where the angle θ=135°, it is determined that the accuracy of information acquired from the camera D is higher than that of information acquired from the camera B.

As another determination method of the detection accuracy, there is a method of calculating an inner product of a unit vector in an image capturing direction of a camera and a unit vector in a traveling direction of light, and determining that the accuracy of information acquired from a camera having the largest inner product is high. In the case of a light detection unit in which a plurality of diodes is arrayed on a two-dimensional plane, the image capturing direction of a camera corresponds to a normal direction with respect to the two-dimensional plane on which the plurality of diodes is arrayed.

When an image capturing direction of a camera 1 and a traveling direction of light are the same, since the apparent speed becomes smaller, the accuracy becomes higher. On the other hand, when an image capturing direction of a camera 2 and a traveling direction of light are opposite, since the apparent speed becomes larger, the accuracy becomes lower. If the image capturing direction is regarded as a first vector, and the traveling direction of light is regarded as a second vector, the accuracy becomes the highest when an angle formed by the first vector and the second vector is 0 degree, and the accuracy becomes the lowest when the angle is 180 degrees. If the angle is 90 degrees or 270 degrees, an influence of the apparent speed does not exist, and the accuracy becomes about an intermediate level between the accuracy at 0 degree and the accuracy at 180 degrees. In other words, a camera having a larger value of cos θ (θ: angle formed by the first vector and the second vector) has relatively high accuracy. Because cost) corresponds to an inner product of a unit vector of the first vector and a unit vector of the second vector, it is sufficient to compare values of the inner products of unit vectors of image capturing directions of cameras and the unit vector of the traveling direction of light.

Figure 14:
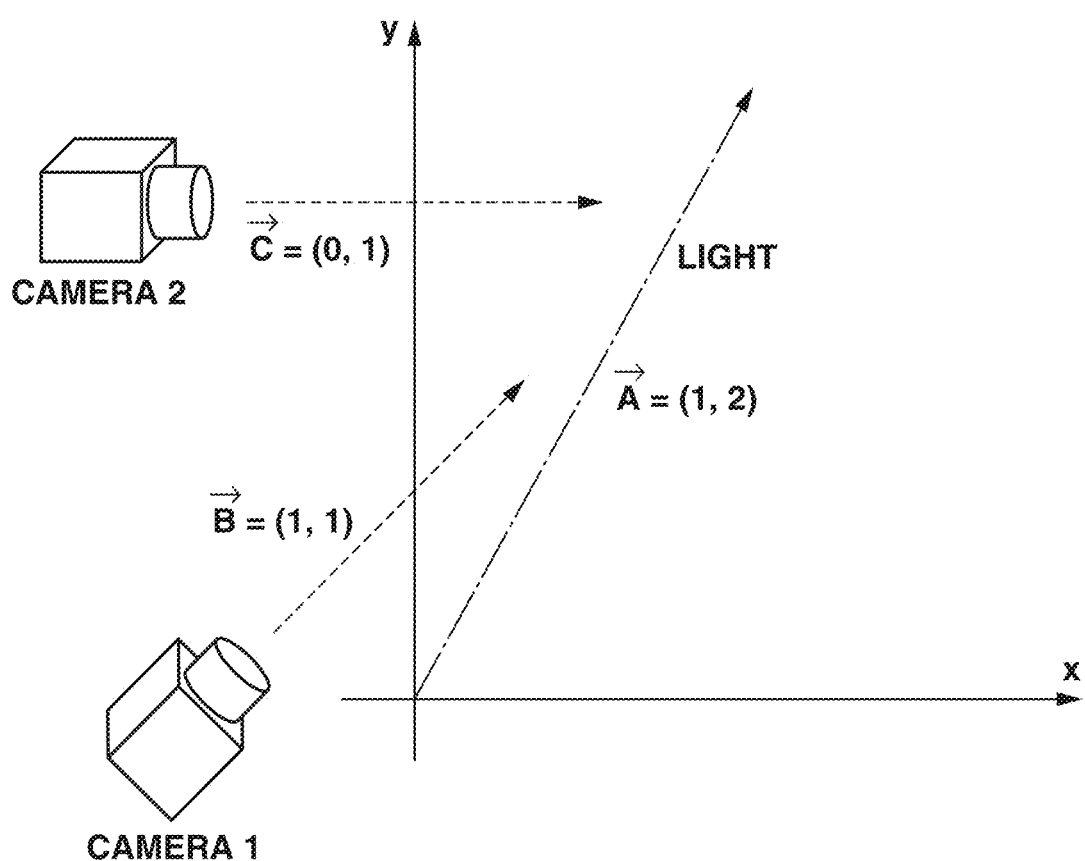
FIG. 14 is a diagram illustrating an arrangement of light detection units.

For example, a case where image capturing is performed on light traveling on the XY-plane, using cameras 1 and 2, will be considered. FIG. 14 illustrates a specific example. In FIG. 14, a traveling direction of light is represented by a vector A=(1, 2), an image capturing direction of the camera 1 is represented by a vector B=(1, 1), and an image capturing direction of the camera 2 is represented by a vector C=(0, 1).

In this case, a unit vector a of the vector A is represented as follows.

$$\vec{a} = \frac{\vec{A}}{|\vec{A}|} = \frac{1}{\sqrt{5}}\vec{A} \qquad \text{[Math. 1]}$$

In addition, a unit vector b of the vector B is represented as follows.

$$\vec{b} = \frac{B}{|\vec{B}|} = \frac{1}{\sqrt{2}} \vec{B} \qquad \text{[Math. 2]}$$

Furthermore, a unit vector c of the vector C is represented as follows.

$$\vec{c} = \frac{C}{|\vec{C}|} = \vec{C} \qquad \text{[Math. 3]}$$

If inner products of the respective unit vectors are compared, the following inequality is obtained.

$$\vec{a} \cdot \vec{b} > \vec{a} \cdot \vec{c} \qquad \text{[Math. 4]}$$

More specifically, because an inner product of the unit vector in the image capturing direction of the camera 1 and the unit vector in the traveling direction of light is larger than an inner product of the unit vector in the image capturing direction of the camera 2 and the unit vector in the traveling direction of light, it is determined that the accuracy of information acquired from the camera 1 is higher than the accuracy of information acquired from the camera 2.

The above description has been given using an example of vectors in a two-dimensional space, but the same applies to a three-dimensional space. By comparing inner products of unit vectors in image capturing directions of cameras and a traveling direction of light, accuracy can be determined.

Aside from accuracy determination performed based on a position of a light detection unit with respect to traveling light, the accuracy may be determined using a degree of fitting between a model and actual measurement values (e.g.: a value of a square sum of residual errors between calculated values calculated by a model and the measured values).

Next, in step S470, the image construction unit 123 selects information from a light detection unit having high detection accuracy, for a light trajectory belonging to each group, and integrates pieces of information. Specifically, in the image capturing of a light trajectory in the first traveling direction, the accuracy of information (first information) acquired by the light detection unit 110 is sometimes higher than the accuracy of information (second information) acquired by the light detection unit 111. In the image capturing of a light trajectory in the second traveling direction, the accuracy of information (second information) acquired by the light detection unit 111 is sometimes higher than the accuracy of information (first information) acquired by the light detection unit 110. In this situation, as for the light trajectory in the first traveling direction, an image is constructed based on the information (first information) acquired by the light detection unit 110, and as for the light trajectory in the second traveling direction, an image is constructed based on the information (second information) acquired by the light detection unit 111.

When the above-described steps are performed, in step S480, the processing ends.

In the above description, the light trajectories are separated into groups by the traveling direction of light, the function search is performed for all groups, and then the vector information regarding the Z direction is estimated, but the function search and estimation of the vector information regarding the Z direction may be performed for each group.

(Second Calculation Processing)

Figure 8:
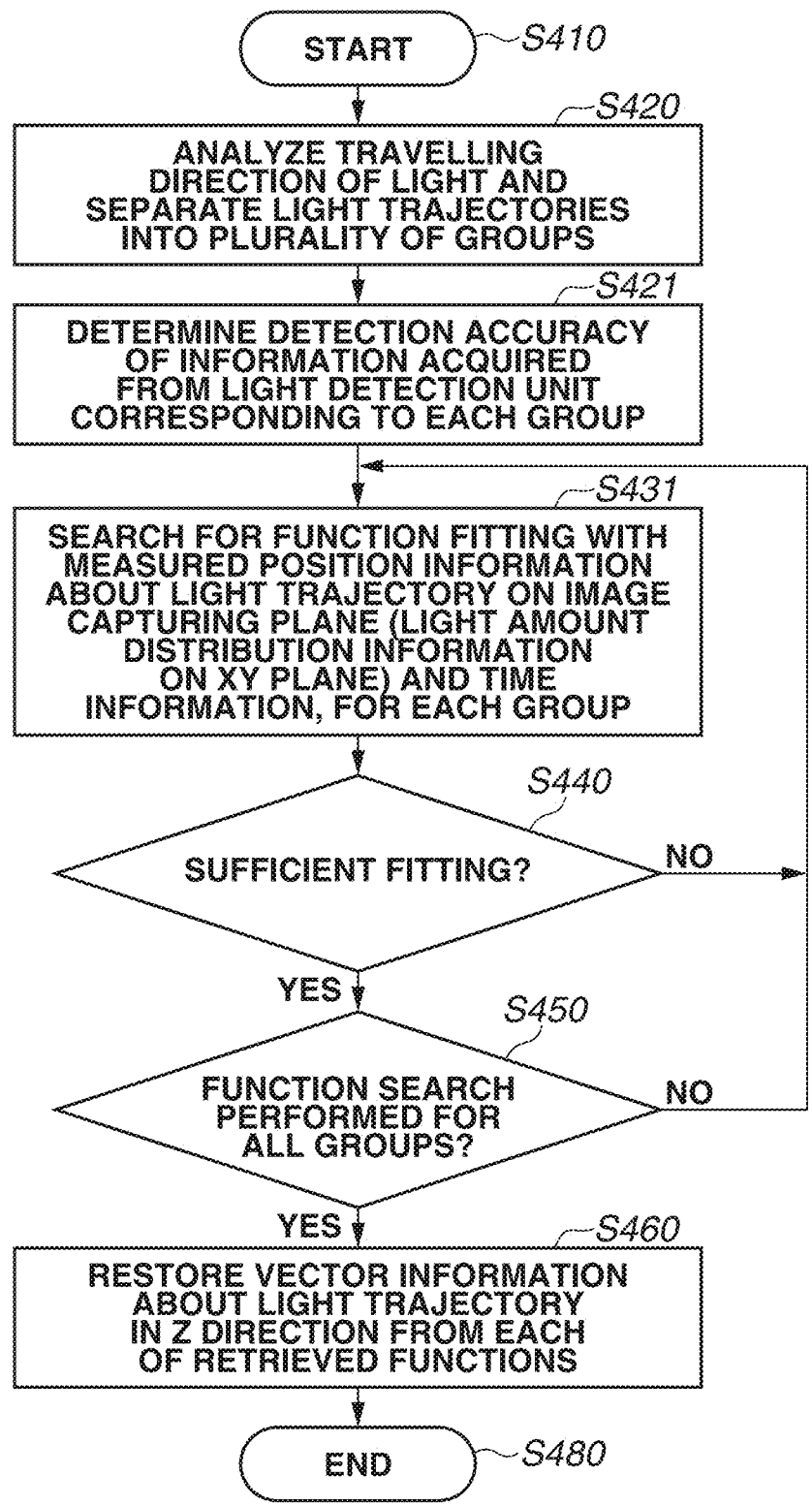
FIG. 8 is a flowchart illustrating processing to be performed by a traveling direction analysis unit, a space information estimation unit, and an image construction unit according to an exemplary embodiment.

FIG. 8 is a diagram illustrating a procedure of calculation processing different from that in FIG. 7.

Similarly to FIG. 7, in step S420, the traveling direction analysis unit 121 analyzes the traveling direction of light and separates light trajectories into a plurality of groups. Such grouping processing is individually performed on pieces of information respectively acquired from the light detection units 110 and 111.

Next, in step S421, the traveling direction analysis unit 121 determines, for each group, which of information acquired by the light detection unit 110 and information acquired by the light detection unit 111 has higher accuracy. While the light detection units 110 and 111 capture images of scattered light from different positions, the light detection units 110 and 111 can individually identify a light trajectory belonging to each group. Position information about a light trajectory (light amount distribution information on the XY-plane) and time information can be acquired from each of the light detection units 110 and 111, it is also possible to acquire the speed of a light trajectory belonging to each group. As described with reference to FIGS. 3D to 3F, the smaller the apparent speed is, the higher the detection accuracy becomes. Thus, for a light trajectory belonging to each group, the processing in subsequent steps is performed using information acquired from the light detection unit that has acquired a slower speed of a light trajectory. The calculation of the speed of a light trajectory is not essential, and it is sufficient to obtain a difference between an observation time of a start point of the light trajectory having a predetermined traveling direction and an observation time of an end point thereof, and determine a light detection unit that has detected a larger difference as the light detection unit with higher detection accuracy for the light trajectory having the predetermined traveling direction.

Next, in step S431, for each group, the space information estimation unit 122 searches for a fitting function using measured position information about a light trajectory on an image capturing plane (light amount distribution information on the XY-plane), and time information corresponding to the position information about each light trajectory. In step S430 illustrated in FIG. 7, the calculation processing of searching for a function is performed on each of data sets respectively acquired by the light detection units 110 and 111, for a light trajectory having the first traveling direction. On the other hand, in step S432 illustrated in FIG. 8, the calculation processing of searching for a function is performed on either the data set acquired by the light detection unit 110 or the data set acquired by the light detection unit 111, for the light trajectory having the first traveling direction. In other words, the calculation is performed on a data set acquired from a light detection unit determined to be capable of acquiring information with high accuracy with regard to the light trajectory having the first traveling direction in the determination of detection accuracy that has been performed in step S421. With this configuration, as compared with the procedure illustrated in FIG. 7, a calculation amount and a calculation time can be reduced.

(Arrangement Example of Light Detection Unit)

Figure 9A:
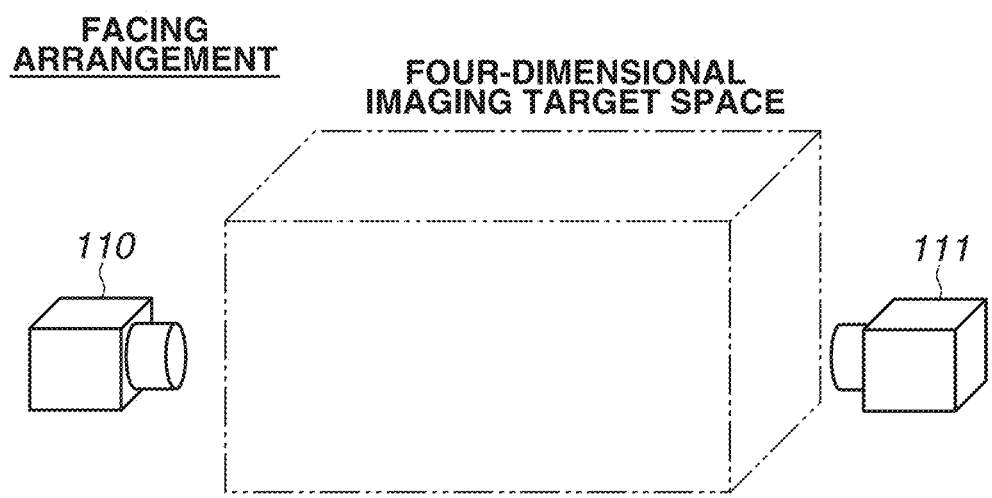
FIGS. 9A and 9B are diagrams each illustrating an arrangement of light detection units.
Figure 9B:
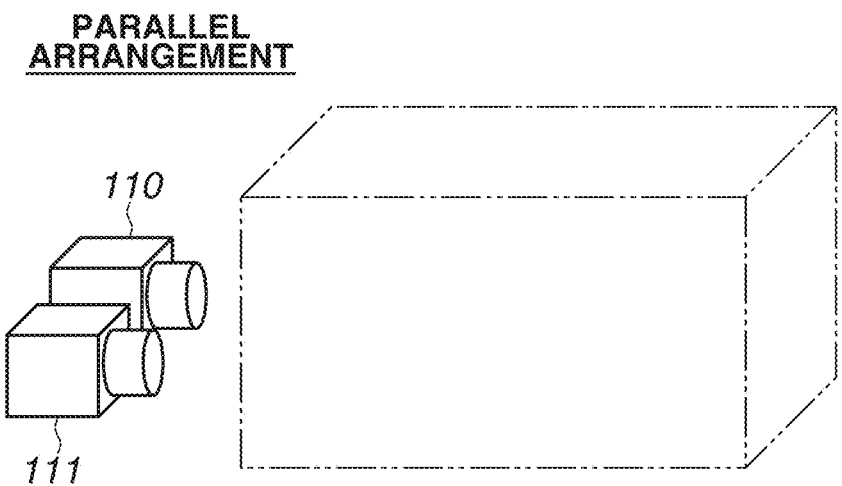

FIGS. 9A and 9B each illustrate an arrangement example of the light detection units 110 and 111.

In FIG. 9A, the light detection units 110 and 111 are arranged facing each other across a four-dimensional imaging target space. If the light detection units 110 and 111 are arranged in this manner, the angle θ at which a camera is provided with respect to the traveling direction of light traveling in the four-dimensional imaging target space does not become smaller than 90°. For this reason, it is possible to suppress a decline in detection accuracy that is attributed to a change in the apparent speed of light, for data acquired from both of the light detection units 110 and 111. In addition, because the detection accuracy of each of the light detection units 110 and 111 varies depending on the traveling direction of light, information acquired from a light detection unit with relatively higher detection accuracy can be used. With this configuration, a light detection system with higher accuracy can be provided.

In FIG. 9B, the light detection units 110 and 111 are arranged in parallel. If the light detection units 110 and 111 are arranged in this manner, the angle θ at which a camera is provided with respect to the traveling direction of light does not greatly vary between the light detection units 110 and 111. Nevertheless, it becomes possible to avoid such arrangement in which both of the light detection units 110 and 111 are arranged at the angle θ of 0° at which the apparent speed becomes infinite. Thus, in the present exemplary embodiment, the light detection units 110 and 111 may be arranged in parallel in this manner Such an arrangement is effective when a space for arranging cameras is limited.

Moreover, if an arrangement in which both of the light detection units 110 and 111 face each other is called an arrangement in a relationship of 180°, both of the light detection units 110 and 111 may be arranged in a relationship of 90° or 270°, which are not illustrated in FIGS. 9A and 9B.

Exemplary Embodiment

FIG. 10 is a diagram illustrating a setup to be used in the present exemplary embodiment.

Pulsed laser light emitted from the light source 112 at a point A is reflected by a plurality of reflecting mirrors serving as optical elements. Specifically, the plurality of reflecting mirrors is provided in such a manner that the pulsed laser light is reflected at points B, C, D, and E. A point F becomes the last point in the four-dimensional imaging target space that can be detected by the light detection unit 110.

The light detection units 110 and 111 are arranged facing each other across the four-dimensional imaging target space. Timings of the light source 112 and the light detection units 110 and 111 are controlled by a pulse generator, and are configured to implement the timings as illustrated in the timing chart in FIG. 5, for example.

FIG. 11 is an image diagram illustrating a light trajectory acquired by the light detection unit 110. The apparent speed of the light trajectory from the points A to F is indicated by different types of line. Specifically, a solid line indicates that the apparent speed is slow, a dotted-line indicates that the apparent speed is normal, and a dashed-dotted line indicates that the apparent speed is fast. If the apparent speed is fast, the accuracy of the four-dimensional information (three-dimensional space information and time information) that can be acquired by the light detection unit 110 becomes lower. Thus, the four-dimensional information regarding a light trajectory from the points E to F, which is indicated by the dashed-dotted line (the apparent speed is fast), is acquired by the light detection unit 111 provided at a position different from the position of the light detection unit 110.

FIG. 12 is an image diagram illustrating a light trajectory acquired by the light detection unit 111. The apparent speed of the light trajectory from the points A to F is indicated by different types of line. Specifically, a solid line indicates that the apparent speed is slow, a dotted-line indicates that the apparent speed is normal, and a dashed-dotted line indicates that the apparent speed is fast. If the apparent speed is fast, the accuracy of the four-dimensional information (three-dimensional space information and time information) that can be acquired by the light detection unit 111 becomes lower. Thus, the four-dimensional information regarding a light trajectory from the points A to B and the points C to D, which is indicated by the dashed-dotted line (the apparent speed is fast), is acquired by the light detection unit 110 provided at a position different from the position of the light detection unit 111.

Figure 13:
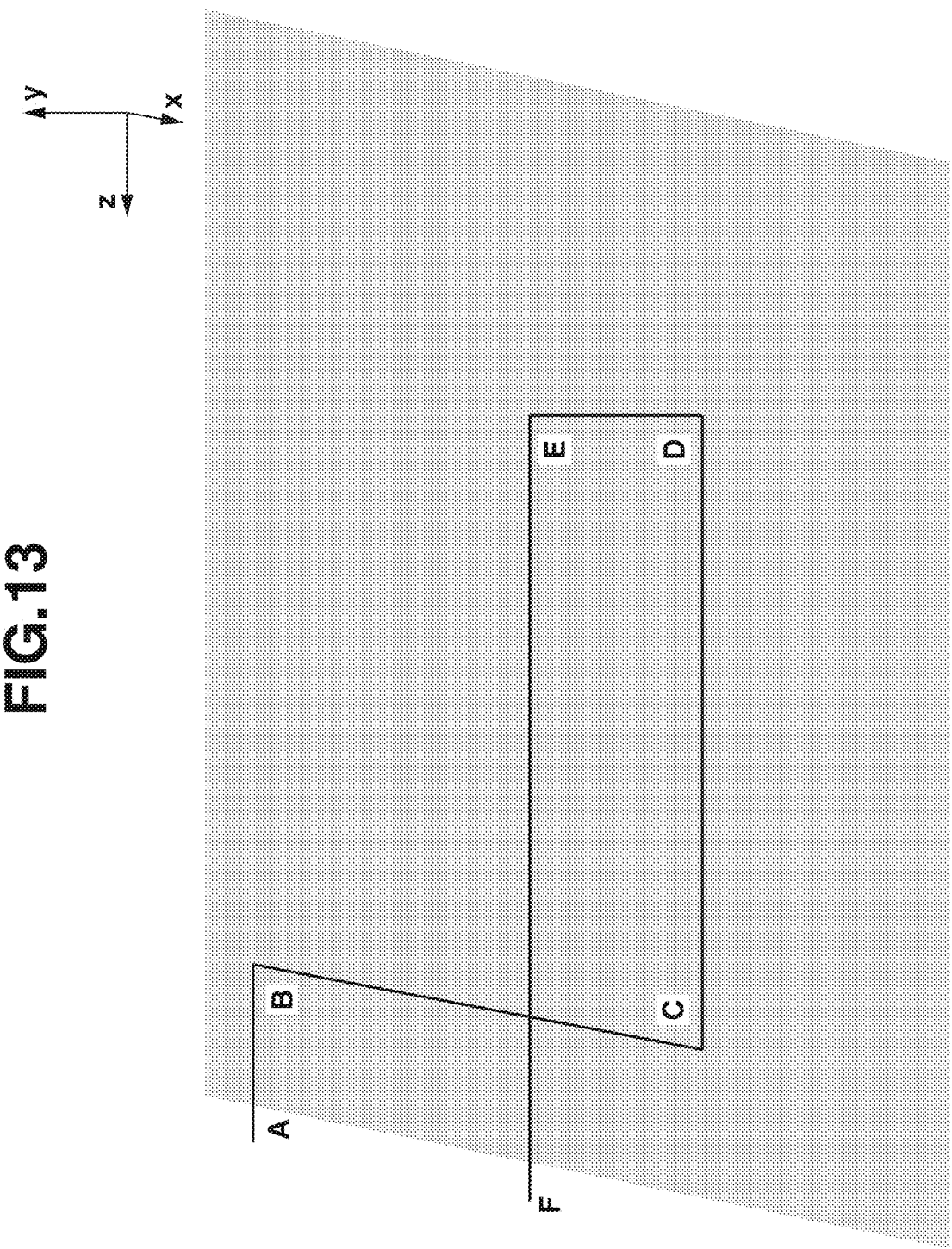
FIG. 13 is a diagram illustrating an output image processed by a calculation processing unit.

FIG. 13 is an image diagram illustrating a light trajectory obtained by combining light trajectories by selecting information with relatively higher accuracy from the plurality of light detection units 110 and 111. More specifically, FIG. 13 is a diagram illustrating a light trajectory of pulsed laser light reconstructed in an XYZ space by selecting three-dimensional information of x, y, and z from four-dimensional information of x, y, z, and t that has been acquired by the light detection units 110 and 111 and the space information estimation unit 122. An image is generated by the image construction unit 123 based on information about a vector component in the Z direction that has been estimated by the space information estimation unit 122, and the generated image is displayed on the display unit 130.

As described above, as for the light trajectory from the points A to B and the points C to D, the information acquired by the light detection unit 110 is selected. On the other hand, as for the light trajectory from the points E to F, the information acquired by the light detection unit 111 is selected and integrated with the above-described information. The information integration is performed by the image construction unit 123.

Since the accuracy is at an equal level between the light detection units 110 and 111 for the light trajectory from the points B to C and the light trajectory from the points D to E, information acquired by whichever of the light detection units 110 and 111 may be selected and integrated. Alternatively, since the accuracy is at an equal level between the light detection units 110 and 111 for the light trajectories between these points, an average value of pieces of information individually acquired by the light detection units 110 and 111 may be used. Alternatively, since the accuracy is at an equal level between the light detection units 110 and 111 as for the light trajectories between these points, for example, weighting for information acquired from the light detection unit 110 may be increased, and weighting for information acquired from the light detection unit 111 may be decreased. For example, if the number of pixels of the light detection unit 110 is larger than the number of pixels of the light detection unit 111, the weighting for the information acquired from the light detection unit 110 may be increased, and the weighting for the information acquired from the light detection unit 111 may be decreased.

(Description of Calculation Model)

Hereinafter, an example of a model to be used for calculation will be described. A more complicated model that takes lens aberration and non-uniformity of sensor characteristics into consideration may be used in place of the following model. In addition, parameter estimation that uses a neural network model may be performed instead of solving a least-square method.

A temporal change of a laser pulse position, $$\vec{r}(t) \quad \text{[Math. 5]}$$

can be described as:

$$\vec{r}(t)=(x(t),y(t),z(t))=\vec{r}_0+ct\cdot\vec{n}. \quad \text{[Math. 6]}$$

In this formula, $$\vec{r}_0=(x_0,y_0,z_0) \quad \text{[Math. 7]}$$

represents a constant vector not dependent on time, where c represents the speed of light, and $$\vec{n}=(n_x,n_y,n_z) \quad \text{[Math. 8]}$$

represents a normalization vector indicating a direction of light propagation. In the formula, t represents a time at which a laser pulse reaches $$\vec{r}(t), \quad \text{[Math. 9]}$$

and has an offset with respect to t', where t' represents a time at which the laser pulse existing at a position of $$\vec{r}(t) \quad \text{[Math. 10]}$$

is detected by a camera. A position of the laser pulse projected onto an image capturing plane (focal plane) of a light detection unit is represented by the following formula.

$$\vec{r}_p(t)=(x_p,y_p,z_p)=\alpha(t)\cdot\vec{r}(t) \quad \text{[Math. 11]}$$

In the formula, $\alpha(t)$ represents a coefficient dependent on time, and $-z_p$ represents a focal length. If $z_p$ is assumed to be not dependent on time, $\alpha(t)$ can be described as $\alpha(t)=z_p/(z_0+ct\cdot n_z)$. A motion of the laser pulse geometrically projected onto the image capturing plane of the light detection unit can be described by Formula (1) described below.

[Math. 12]

$$x_p(t) = \frac{z_p}{z_0 + ct\cdot n_z}\cdot(x_0+ct\cdot n_x), \; y_p(t) = \frac{z_p}{z_0+ct\cdot n_z}\cdot(y_0+ct\cdot n_y). \quad (1)$$

If a light propagation time from $$\vec{r}(t) \quad \text{[Math. 13]}$$

to the light detection unit is considered, the observation time t' can be described by Formula (2) described below.

[Math. 14]

$$t' = t + \frac{|\vec{r}(t)|}{c} = t + \frac{1}{c}\cdot\sqrt{|\vec{r}_0|^2 + 2ct(\vec{r}_0\cdot\vec{n}) + c^2t^2}. \quad (2)$$

If the above-described formula is solved, Formula (3) described below is obtained.

[Math. 15]

$$t = f(t') = \frac{1}{2}\cdot\frac{c^2t'^2 - |\vec{r}_0|^2}{c^2t' + c(\vec{r}_0\cdot\vec{n})}. \quad (3)$$

If Formula (3) is substituted into Formula (1), a position of the laser pulsed light projected onto the image capturing plane, which is a function of the observation time t', can be described by Formula (4) described below.

[Math. 16]

$$x_p(t') = \frac{z_p}{z_0 + c\cdot f(t')\cdot n_z}\cdot(x_0 + c\cdot f(t')\cdot n_x), \quad (4)$$

$$y_p(t') = \frac{z_p}{z_0 + c\cdot f(t')\cdot n_z}\cdot(y_0 + c\cdot f(t')\cdot n_y).$$

By a time-resolved measurement, N set(s) of data of a three-dimensional data point $(X_p^i, Y_p^i, T'^i)$ can be acquired (i=1, 2, . . . , N). To reproduce four-dimensional light, six parameters, which are $x_0$, $y_0$, $z_0$, $n_x$, $n_y$, and $n_z$, are set, and an optimization issue represented by a Formula (5) described below is solved.

[Math. 17]

$$(\vec{r}_0, \vec{n}) = \underset{r_0,n}{\operatorname{argmin}}\left[\sum_i^N\left\{X_p' - \frac{z_p}{z_0+c\cdot f(T'^i)\cdot n_z}\cdot(x_0+c\cdot f(T'^i)\cdot n_x)\right\}^2 + \right.$$
$$\left.\sum_i^N\left\{Y_p' - \frac{z_p}{z_0+c\cdot f(T'^i)\cdot n_z}\cdot(y_0+c\cdot f(T'^i)\cdot n_y)\right\}^2\right], \quad (5)$$

In the formula, N represents the total number of measured data points, $(X_p^i, Y_p^i)$ represents a position of a pixel on the image capturing plane for an i-th data point, $-z_p$ represents a focal length, $T'^i$ represents a measured observation time for an i-th data point, and $$\vec{r}_0=(x_0,y_0,z_0) \quad \text{[Math. 18]}$$

represents a position of the laser light at t=0.

In Formula 5, when a normalized light propagation vector is represented by a polar coordinate system, $$\vec{n}=(\sin\theta\cos\phi, \sin\theta\sin\phi, \cos\theta) \quad \text{[Math. 19]}$$

is obtained. If Formula 5 is converted into the polar coordinate system, Formulas (6) and (7) described below are obtained.

[Math. 20]

$$(\vec{r}_0, \theta, \phi) = \quad (6)$$
$$\underset{r_0,\theta,\phi}{\operatorname{argmin}}\left[\sum_i^N\left\{X_p^i - \frac{z_p}{z_0+c\cdot f(T'^i)\cdot\cos\theta}\cdot(x_0+c\cdot f(T'^i)\cdot\sin\theta\cos\phi)\right\}^2 + \right.$$
$$\left.\sum_i^N\left\{Y_p' - \frac{z_p}{z_0+c\cdot f(T'^i)\cdot\cos\theta}\cdot(y_0+c\cdot f(T'^i)\cdot\sin\theta\sin\phi)\right\}^2\right],$$

[Math. 21]

$$f(T') = \frac{1}{2}\cdot\frac{c^2T'^2 - (x_0^2+y_0^2+z_0^2)}{c^2T' + c(x_0\sin\theta\cos\phi + y_0\sin\theta\sin\phi + z_0\cos\theta)}, \quad (7)$$

In above-described Formulas (6) and (7), an optimization issue is solved by setting five parameters, which are $x_0$, $y_0$, $z_0$, $\theta$, and $\varphi$.

Features of the above-described model lie in the following three points.

More specifically, the first point lies in that "straightness of light" and "principle of constancy of the light speed" are assumed. The second point lies in that two-dimensional coordinates (Xp, Yp) on the image capturing plane are calculated by projecting a position (x, y, z) of the pulsed light onto the image capturing plane. The third point lies in that a detection time T' is calculated in consideration of a time taken for scattered light to reach a camera with respect to a time t at which pulsed light reaches the position (x, y, z).

On the other hand, in the case of a trajectory with a small number of data points, there is a possibility that a value diverges or converges to a wrong solution when an optimization issue is solved. In view of the foregoing, if continuity of a light trajectory is assumed, the issue can be avoided. Specifically, if there is a plurality of trajectories, a constraint condition may be added in which a start point of a second trajectory is set to be an end point of a first trajectory.

More specifically, with respect to the second trajectory, it is sufficient to add a cost function (loss function) $\lambda*\{(x_c-x_0-ct_c*n_x)^2+(y_c-y_0-ct_c*n_y)^2+(z_c-z_0-ct_c*n_z)^2\}$ to Formula (5). In the function, $(x_c, y_c, z_c, t_c)$ represent four-dimensional coordinates of the end point of the first trajectory. Alternatively, instead of adding the function to a formula of the least-square method, the end point of the first trajectory may be set as an initial condition in estimating the second trajectory.

OTHER EMBODIMENTS

In the above-described exemplary embodiment, the function fitting the actual measurement value (x, y, t) of a camera is searched for, and the vector component in the Z direction among vectors in the traveling direction of the light is restored from the fitting function. On the other hand, a value of the apparent light speed may be calculated from the actual measurement value (x, y, t) of a camera, and the vector component in the Z direction among the vectors in the traveling direction of the light may be restored. In this case, the vector component in the Z direction among the vectors in the traveling direction of the observation target light is estimated from the data set.

In the above-described exemplary embodiment, the description has been given on the assumption that an SPAD camera that uses an avalanche diode is used, but the SPAD camera does not have to be used if a camera that can perform high-speed image capturing is used.

In FIG. 10, image capturing of a light trajectory changed by a plurality of reflecting mirrors has been described, but application of the above-described exemplary embodiment is not limited to such image capturing, and can also be applied to the following analysis.

(Estimation of Three-Dimensional Shape)

By identifying a light trajectory of light entering a reflector, and a light trajectory of light reflected by the reflector, information regarding a normal vector of a micro region in the reflector can be obtained. In addition, by scanning laser light from a light source, information regarding normal vectors of a plurality of micro regions can be obtained. Furthermore, from a light detection unit in which a plurality of diodes is arrayed in an in-plane direction of the X and Y directions, a data set including a plurality of pieces of data each including light amount distribution information, and time information indicating a time at which the light amount distribution information is acquired can be acquired. From these pieces of information, a vector component in a direction (Z direction) orthogonal to the XY-plane among vectors in the traveling direction of observation target light can be estimated. Accordingly, the vector component in a Z-axis direction among the normal vectors of the above-described micro regions can be estimated. Consequently, it is also possible to estimate a three-dimensional shape of the reflector from a data set of incident light and reflected light. In particular, since a light detection unit with high detection accuracy can be selected by using the plurality of light detection units, the three-dimensional shape of the reflector with high accuracy can be estimated.

(Estimation of Refractive Index Distribution)

By observing light passing through an object (precisely, scattered light of the light passing through an object), it is possible to acquire refractive index distribution information about the object. For example, in an object having a first region and a second region, if a refractive index of the first region and a refractive index of the second region are different, a traveling speed of light varies between the first region and the second region. From the light detection unit in which a plurality of diodes is arrayed in an in-plane direction of the X and Y directions, a data set including a plurality of pieces of data each including light amount distribution information, and time information indicating a time at which the light amount distribution information is acquired can be acquired. Thus, based on these pieces of information, the refractive index distribution information about an object can be acquired. In particular, since a light detection unit with high detection accuracy can be selected by using the plurality of light detection units, it becomes possible to acquire the refractive index distribution information with higher accuracy.

In addition, using the above-described data set, the vector component in the direction (Z direction) orthogonal to the XY-plane among vectors in the traveling direction of observation target light can also be estimated. Thus, it is possible to acquire the refractive index distribution information about an object having refractive index distribution varying in the Z direction. In particular, since a light detection unit with high detection accuracy can be selected by using the plurality of light detection units, it is possible to acquire the refractive index distribution information with higher accuracy.

(Others)

An exemplary embodiment of the disclosure is not limited to the above-described exemplary embodiment, and various modifications can be made. For example, an example in which part of a configuration of an exemplary embodiment is added to another exemplary embodiment, and an example in which part of a configuration of an exemplary embodiment is replaced with part of a configuration of another exemplary embodiment are regarded as exemplary embodiments of the disclosure.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2020-124548, filed Jul. 21, 2020, and No. 2021-059047, filed Mar. 31, 2021, which are hereby incorporated by reference herein in their entirety.

What is claimed is:

1. A system comprising:
   a first detection unit in which a plurality of diodes is arrayed on a two-dimensional plane;
   a second detection unit in which a plurality of diodes is arrayed on a two-dimensional plane; and
   a processing unit configured to perform calculation processing on a data set including a plurality of pieces of data each including light amount distribution information on the two-dimensional plane that is acquired by the first detection unit and the second detection unit, and time information indicating a time at which the light amount distribution information is acquired, wherein the processing unit includes an estimation unit configured to estimate, from the data set, a vector component in a direction orthogonal to the two-dimensional plane of the first detection unit and a vector component in a direction orthogonal to the two-dimensional plane of the second detection unit, among vectors in traveling directions of observation target light.

2. The system according to claim 1, wherein, in estimation of the vector component in the direction orthogonal to the two-dimensional plane of the first detection unit or the second detection unit, a model for calculating two-dimensional space information on the first detection unit or the second detection unit and time information, from three-dimensional space information and time information, is used.

3. The system according to claim 2, wherein the three-dimensional space information and the time information are acquired by fitting the data set and the two-dimensional space information on the first detection unit or the second detection unit and the time information that have been calculated using the model, and a vector component in the direction orthogonal to the two-dimensional plane of the first detection unit or the second detection unit is estimated from the acquired three-dimensional space information and the time information.

4. The system according to claim 3, wherein the processing unit includes a construction unit configured to construct an image from the three-dimensional space information and the time information that have been acquired by the fitting.

5. The system according to claim 1, wherein detection accuracy of information acquired from the first detection unit and detection accuracy of information acquired from the second detection unit are determined.

6. The system according to claim 5, wherein the processing unit determines the detection accuracy using
a unit vector in a normal direction with respect to the two-dimensional plane of the first detection unit,
a unit vector in a normal direction with respect to the two-dimensional plane of the second detection unit, and
a unit vector in a traveling direction of light acquired by the first detection unit or the second detection unit.

7. The system according to claim 6, wherein the detection accuracy is determined by comparing
an inner product of the unit vector in the normal direction with respect to the two-dimensional plane of the first detection unit and the unit vector in the traveling direction of the light, and
an inner product of the unit vector in the normal direction with respect to the two-dimensional plane of the second detection unit and the unit vector in the traveling direction of the light.

8. The system according to claim 5, wherein the detection accuracy is determined based on an apparent speed of light in a first traveling direction that has been acquired by the first detection unit and an apparent speed of light in the first traveling direction that has been acquired by the second detection unit.

9. The system according to claim 5, wherein, based on the detection accuracy, information from the first detection unit and information from the second detection unit are integrated.

10. The system according to claim 1, wherein the processing unit includes an analysis unit configured to analyze a traveling direction of light acquired by the first detection unit and the second detection unit.

11. The system according to claim 1,
wherein each of the diodes is an avalanche diode,
wherein the first detection unit and the second detection unit include a control unit configured to control a start and an end of light detection by the avalanche diode,
wherein, in a first frame, a period from a start time of emission of light from a light source to a start time of light detection by the avalanche diode that is controlled by the control unit is a first period,
wherein, in a second frame, a period from a start time of emission of light from the light source to a start time of light detection by the avalanche diode that is controlled by the control unit is a second period, and
wherein a length of the first period and a length of the second period are different.

12. The system according to claim 11, wherein, in the first frame and the second frame, operations of a start of the emission of light from the light source and a start of the light detection by the avalanche diode are repeatedly performed.

13. The system according to claim 11, further comprising a counter configured to count light entering the avalanche diode,
wherein the control unit is a switch provided between the avalanche diode and the counter, or a logic circuit.

14. The system according to claim 11, further comprising a counter configured to count light entering the avalanche diode,
wherein the control unit inputs a signal for switching between operation and non-operation of the counter, to the counter.

15. A system comprising:
a first detection unit in which a plurality of diodes is arrayed on a two-dimensional plane;
a second detection unit in which a plurality of diodes is arrayed on a two-dimensional plane; and
a processing unit configured to perform calculation processing on a data set including a plurality of pieces of data each including light amount distribution information on the two-dimensional plane that is acquired by the first detection unit and the second detection unit, and time information indicating a time at which the light amount distribution information is acquired,
wherein the processing unit acquires detection accuracy of information acquired from the first detection unit and detection accuracy of information acquired from the second detection unit based on information regarding a traveling direction of light that has been acquired by performing calculation processing on the data set.

16. The system according to claim 15, wherein the processing unit determines the detection accuracy using
a unit vector in a normal direction with respect to the two-dimensional plane of the first detection unit,
a unit vector in a normal direction with respect to the two-dimensional plane of the second detection unit, and
a unit vector in a traveling direction of light acquired by the first detection unit or the second detection unit.

17. The system according to claim 16, wherein the detection accuracy is determined by comparing
an inner product of the unit vector in the normal direction with respect to the two-dimensional plane of the first detection unit and the unit vector in the traveling direction of the light, and an inner product of the unit vector in the normal direction with respect to the two-dimensional plane of the second detection unit and the unit vector in the traveling direction of the light.

18. The system according to claim 15, wherein the detection accuracy is determined based on an apparent speed of light in a first traveling direction that has been acquired by the first detection unit and an apparent speed of light in the first traveling direction that has been acquired by the second detection unit.

19. The system according to claim 15, wherein, based on the detection accuracy, information from the first detection unit and information from the second detection unit are integrated.

\* \* \* \* \*